(12) United States Patent  (10) Patent No.: US 6,473,338 B2
Sugimura  (45) Date of Patent: Oct. 29, 2002

(54) ANALOG VOLTAGE SUPPLY CIRCUIT FOR A NON-VOLATILE MEMORY

(75) Inventor: Naoaki Sugimura, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/840,884

(22) Filed: Apr. 25, 2001

(65) Prior Publication Data

US 2001/0040825 A1 Nov. 15, 2001

(30) Foreign Application Priority Data

Apr. 26, 2000 (JP) .................................. 2000-131531
Nov. 30, 2000 (JP) .................................. 2000-364603

(51) Int. Cl.⁷ .......................... G11C 16/04; G11C 16/06
(52) U.S. Cl. .......................... 365/185.03; 365/185.21; 365/185.22
(58) Field of Search .................. 365/185.03, 185.21, 365/185.22

(56) References Cited

U.S. PATENT DOCUMENTS

| | | | |
|---|---|---|---|
| 5,615,154 A | * 3/1997 | Yamada | 365/185.22 |
| 5,638,320 A | 6/1997 | Wong et al. | 365/185.03 |
| 5,712,815 A | * 1/1998 | Bill et al. | 365/185.22 |
| 5,828,601 A | * 10/1998 | Hollmer et al. | 365/185.22 |
| 5,828,604 A | * 10/1998 | Kawai et al. | 365/185.22 |

* cited by examiner

*Primary Examiner*—Trong Phan
(74) *Attorney, Agent, or Firm*—Volentine Francos, PLLC

(57) ABSTRACT

An electric circuit for writing an analog voltage to a non-volatile memory that improves accuracy of the write voltage and shortens the writing time of the analog voltage to the memory. The circuit includes a write voltage generation circuit that varies the write voltage responsive to control signals, a multi-level sense amplifier that compares a current mirror ratio current of a drain current of the memory with a reference comparison current, a comparison circuit that compares an output of the sense amplifier with a write pulse count, and an up-down shift register that outputs the control signals based on the comparison result. The write period and the rise time of a threshold voltage value are compared so that the write voltage can be made to vary and a most suitable write condition can be provided.

8 Claims, 24 Drawing Sheets

SG > Vref
Vss < GND

SG>Vref

0:Vcg-Ids Characteristic of MC before Start of Write Operation

1:Vcg-Ids Characteristic of MC at SAOUT0 = L-H

2:Vcg-Ids Characteristic of MC at SAOUT1 = L-H

3:Vcg-Ids Characteristic of MC at SAOUT2 = L-H

4:Vcg-Ids Characteristic of MC at SAOUT = L-H (MP5 Ids Current)

1':Current Ids of MP8 at SAOUT0 = L-H

2':Current Ids of MP7 at SAOUT1 = L-H

3':Current Ids of MP6 at SAOUT2 = L-H (MC: memory cell)

0: Vcg-Ids Characteristic of MC before Start of Write Operation

1: Vcg-Ids Characteristic of MC at SAOUT0 = L-H

2: Vcg-Ids Characteristic of MC at SAOUT1 = L-H

3: Vcg-Ids Characteristic of MC at SAOUT2 = L-H

4: Vcg-Ids Characteristic of MC at SAOUT = L-H (MC: memory cell)

FIG.22

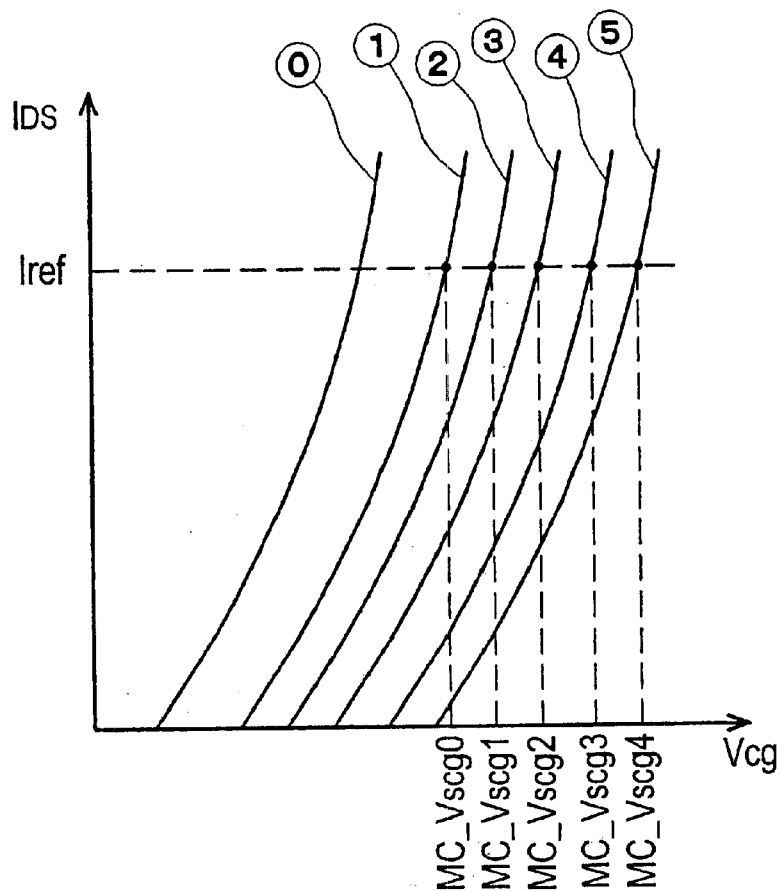

0: Vcg-Ids Characteristic of MC before Start of Write Operation
1: Vcg-Ids Characteristic of MC at SAOUT = L-H w. MC_Vscg0 (SX0=H)
2: Vcg-Ids Characteristic of MC at SAOUT = L-H w. MC_Vscg1 (SX1=H)
3: Vcg-Ids Characteristic of MC at SAOUT = L-H w. MC_Vscg2 (SX2=H)
4: Vcg-Ids Characteristic of MC at SAOUT = L-H w. MC_Vscg3 (SX3=H)
5: Vcg-Ids Characteristic of MC at SAOUT = L-H w. MC_Vscg4 (SX4=H)
[w. MC_VscgN (SXN=N):with set voltage of MC_VscgN (SXN=H), N=0–4]

ANALOG VOLTAGE SUPPLY CIRCUIT FOR A NON-VOLATILE MEMORY

BACKGROUND OF THE INVENTION

1. Field of the Invention

The present invention relates to technique for writing the analog voltage to an electrically writable and erasable non-volatile memory, thereby having the analog voltage memorized therein, and more particularly, relates to an electrical circuit capable of making use of this technique for well correcting unevenness in the write characteristics between memory cells and the deterioration of the write characteristic due to the endurance failure, thereby reducing unevenness in the analog voltage written to memory cells due to unevenness in the write characteristics between cells and improving the endurance or the life time of the memory cell.

2. Description of the Related Art

So far, various proposals have been made with respect to a method for memorizing a certain amount of analog electric charges in the non-volatile memory and a circuit capable of performing the same. For instance, the U.S. Pat. No. 5,638,320 (granted on Jun. 10, 1997) is an example of those proposals. This patent discloses a method for memorizing a desired amount of analog electric charges in the non-volatile memory and a circuit capable of doing the same (see the description from 6th line of page 16 to 19th line of page 18 of the specification thereof referring to reference figures shown as FIG. 12a on Sheet No. 29/63 through FIG. 15h on Sheet No. 40/63). The method disclosed by this patent is summarized as follows.

The threshold voltage value of the non-volatile memory is decreased with the increase of the write period of time. The variation amount of the threshold voltage per unit time is decreased and gets in the saturated state, eventually. This saturated threshold voltage is in proportion to the control voltage at the time of the write operation. This control voltage in proportion to the analog voltage is repetitively written to the non-volatile memory cell at a predetermined short write period of time (write operation). The threshold voltage of the memory cell is read out during the write operation and is compared with the analog voltage to be written (verify operation). This write/verify operations are repeated and the write operation is terminated when the threshold voltage as read out has reached the analog voltage to be written.

Furthermore, the above patent also discloses a method capable of improving the accuracy of the written analog voltage and shortening the write period of time. According to this method, the control voltage to be written during the repetitive write/verify operation and the time interval of the write/verify operation are made no to keep constant but to be variable (refer to reference figures shown as FIG. 15a on Sheet No. 33/63 through FIG. 15h on Sheet 40/63).

However, the purpose of this method is to finish the write operation of the analog voltage to a target non-volatile memory within a predetermined period of time as well as to improve the accuracy of the written analog voltage, regardless of the initial write speed of the memory cell. In general, however, the memory includes memory cells having an initial write speed which is made slow from the first or made slow due to the endurance deterioration. The method is trying to overcome this by means of expediting the initial write speed, for instance by setting the initial write control voltage to be higher than the ordinarily adopted voltage in proportion to the analog voltage and/or setting the pulse width of the initial write pulses to be narrower, thereby enhancing the efficiency of the electric charge injection. According to this method, however, some memory cells having a fast initial write speed might reach a predetermined analog voltage soon while the others might not. As a result, the accuracy of the written analog voltage can not be fine but be rough.

Therefore, there is no way but lowering the initial write speed in order to prevent the memory cell having a fast initial write speed from reaching the analog voltage at the time of the initial write operation. Accordingly, this method can not provide any effective countermeasure as far as the memory cell having a fast initial write speed concerns, so that it would be hard to say that the method adequately responds to such a purpose as described above.

SUMMARY OF THE INVENTION

The present invention has been made in consideration of the problems involved in the conventional circuit writing an analog voltage to the non-volatile memory. The object of the present invention is to provide a novel and improved circuit writing an analog voltage to the non-volatile memory, which makes it possible to improve the accuracy of the write voltage and also to shorten the write time as well.

In order to solve the problems as described above, according to the invention, there is provided an analog voltage supply circuit for a non-volatile memory (electrically writable and erasable). This circuit (100) includes a write voltage generation circuit (110) which generates a write voltage (Vpp) applied to a control gate of a memory cell in said non-volatile memory during write operation, based on an input analog voltage; a verify voltage generation circuit (120) which generates a verify voltage (VVFY) applied to said control gate during verify operation, based on said input analog voltage; a source voltage generation circuit (135) which generates a source voltage (VSource) applied to a source of said memory cell during write operation, wherein said source voltage is changed by varying the gain of an inverting amplifier by inputting a control signal (S0~S4); a multi-level sense amplifier (140) which compares the current mirror ratio current of the memory cell drain current with a reference comparison current (Iref) during verify operation; a counter decoder circuit (150) which outputs a signal equivalent to a predetermined number of write pulses to said memory cell; a comparison circuit (160) which compares the output of said multi-level sense amplifier with that of said counter decoder; and an up-down shift register circuit (170) which shifts the level of said control signals based on a comparison result obtained by said comparison circuit.

Furthermore, according to the invention, there is provided an analog voltage supply circuit for a non-volatile memory (electrically writable and erasable). This circuit (200) includes Analog voltage supply circuit for a non-volatile memory comprising: a write voltage generation circuit (110) which generates a write voltage (Vpp) applied to a control gate of a memory cell in said non-volatile memory during write operation, based on an input analog voltage; a verify voltage generation circuit (120) which generates a verify voltage (VVFY) applied to said control gate during verify operation, based on said input analog voltage; a source voltage generation circuit (135) which generates a source voltage (VSource) applied to a source of said memory cell during write operation, wherein said source voltage is changed by varying the gain of an inverting amplifier by inputting a control signal (S0~S4); a multi-level sense amplifier (140) which compares the memory cell drain current with the current mirror ratio current of a reference comparison current (Iref) during verify operation; a counter decoder circuit (150) which outputs a signal equivalent to a predetermined number of write pulses to said memory cell; a comparison circuit (160) which compares the output of said multi-level sense amplifier with that of said counter decoder; and an up-down shift register circuit (170) which shifts the level of said control signals based on a comparison result obtained by said comparison circuit.

Still further, according to the invention, there is provided an analog voltage supply circuit for a non-volatile memory (electrically writable and erasable). This circuit (300) includes a write voltage generation circuit (210) which generates a write voltage (Vpp) applied to a control gate of a memory cell in said non-volatile memory during write operation, based on an input analog voltage, and which changes write voltage by increasing the voltage of the electrode of an electric charge distribution condenser (C1) connected with the negative terminal of a condenser ratio amplifier as well as the voltage of another electrode of the condenser (C1) not connected with the same in response to the input of the first control signals (S0~S4); a verify voltage generation circuit (120) which generates a verify voltage (VVFY) applied to said control gate during verify operation, based on said input analog voltage; a source voltage generation circuit (235) which generates a verify source voltage (VVFYSource) applied to a source of said memory cell during verify operation, wherein said verify source voltage is changed by varying the gain of an inverting amplifier by inputting the second control signals (SX0~SX4); a sense amplifier (240) which compares the memory cell drain current with the reference comparison current (Iref) during verify operation; a counter decoder circuit which outputs a signal equivalent to a predetermined number of write pulses to said memory cell; and an up-down shift register circuit (170) which shifts the level of said first control signals (S0~S4) based on the output (SAOUT0) of said sense amplifier.

Still further, according to the invention, there is provided an analog voltage supply circuit for a non-volatile memory (electrically writable and erasable). This circuit (400) includes a write voltage generation circuit (110) which generates a write voltage (Vpp) applied to a control gate of the memory cell in said non-volatile memory during write operation, based on an input analog voltage; a verify voltage generation circuit (120) which generates a verify voltage (VVFY) applied to said control gate during verify operation, based on said input analog voltage; a source voltage generation circuit (135) which generates a source voltage (VVFYSource) applied to a source of said memory cell during write operation, wherein said source voltage is changed by changing the gain of an inverting amplifier by inputting the first control signals (S0~S4); a source voltage generation circuit (235) which generates a verify source voltage applied to a source of said memory cell during verify operation, wherein said output verify source voltage is changed by changing the gain of the inverting amplifier by inputting the second control signals (SX0~SX4); a sense amplifier (240) which compares the memory cell drain current with the reference comparison current during verify operation; a counter decoder circuit (150) which outputs a signal equivalent to a predetermined number of write pulses to said memory cell; and an up-down shift register circuit (170) which shifts the level of said first control signals based on a sense amplifier output.

Still further, according to the invention, there is provided an analog voltage supply circuit for a non-volatile memory (electrically writable and erasable). This circuit (500) includes a write voltage generation circuit (210) which generates a write voltage (Vpp) applied to a control gate of a memory cell in said non-volatile memory during write operation, based on an input analog voltage, and which changes write voltage by increasing the voltage of the electrode of an electric charge distribution condenser (C1) connected with the negative terminal of a condenser ratio amplifier as well as the voltage of another electrode of the condenser (C1) not connected with the same in response to the input of the first control signals (S0~S4); a verify voltage generation circuit (120) which generates a verify voltage (VVFY) applied to said control gate during verify operation, based on said input analog voltage; a write memory cell drain voltage generation circuit (VW voltage generation circuit 125) which generates a write memory cell drain voltage (VW voltage) during write operation, said write memory cell drain voltage is changed by varying the gain of a non-inverting amplifier; a multi-level sense (140) amplifier which compares the current mirror ratio current of the memory cell drain current with a reference comparison current (Iref) during verify operation; a counter decoder circuit (150) which outputs a signal equivalent to a predetermined number of write pulses to said memory cell; a comparison circuit (160) which compares the output of said multi-level sense amplifier with the output of said counter decoder; and an up-down shift register circuit (170) which shifts the level of said first control signals based on a comparison result of said comparison circuit.

Still further, according to the invention, there is provided an analog voltage supply circuit for a non-volatile memory (electrically writable and erasable). This circuit (600) includes a write voltage generation circuit (310) which generates a write voltage (Vpp) applied to a control gate of a memory cell in said non-volatile memory during write operation, based on an input analog voltage, and which changes the write voltage by increasing the voltage of the positive terminal of a condenser ratio amplifier of an electric charge distribution condenser (C1) in response to the input of the control signals (S0~S4); a verify voltage generation circuit (120) which generates a verify voltage (VVFY) applied to said control gate during verify operation, based on said input analog voltage; a write memory cell drain voltage generation circuit (VW voltage generation circuit 125) which generates a write memory cell drain voltage (VW voltage) during write operation, said write memory cell drain voltage is changed by varying the gain of a non-inverting amplifier; a multi-level sense amplifier (140) which compares the current mirror ratio current of the memory cell drain current with a reference comparison current during verify operation; a counter decoder circuit (150) which outputs a signal equivalent to a predetermined number of write pulses to said memory cell; a comparison circuit (160) which compares the output of said multi-level sense amplifier with the output of said counter decoder; and an up-down shift register circuit (170) which shifts the level of said control signals based on a comparison result of said comparison circuit.

Still further, according to the invention, there is provided an analog voltage supply circuit for a non-volatile memory (electrically writable and erasable). This circuit (700) includes a write voltage generation circuit (210) which generates a write voltage (Vpp) applied to a control gate of a memory cell in said non-volatile memory during write operation, based on an input analog voltage, and which changes the write voltage by increasing the voltage of the electrode of an electric charge distribution condenser (C1)

connected with the negative terminal of a condenser ratio amplifier as well as the voltage of another electrode of the condenser (C1) not connected with the same in response to the input of the control signals; a verify voltage generation circuit (120) which generates a verify voltage (VVFY) applied to said control gate during verify operation, based on said input analog voltage; a write memory cell drain voltage generation circuit (VW voltage generation circuit 125) which generates a write memory cell drain voltage (VW voltage) during write operation, said write memory cell drain voltage is changed by varying the gain of a non-inverting amplifier; a multi-level sense amplifier (240) which compares the memory cell drain current with the current mirror ratio current of the reference comparison current (Iref) during verify operation; a counter decoder circuit (150) which outputs a signal equivalent to a predetermined number of write pulses to said memory cell; a comparison circuit (160) which compares the output of said multi-level sense amplifier with the output of said counter decoder; and an up-down shift register circuit (170) which shifts the level of said control signals based on a comparison result of said comparison circuit.

Still further, according to the invention, there is provided an analog voltage supply circuit for a non-volatile memory (electrically writable and erasable). This circuit (800) includes a write voltage generation circuit (310) which generates a write voltage (Vpp) applied to a control gate of a memory cell in said non-volatile memory during write operation, based on an input analog voltage, and which changes the write voltage by increasing the voltage of the positive terminal of a condenser ratio amplifier of an electric charge distribution condenser by inputting the control signals (S0~S4); a verify voltage generation circuit (120) which generates a verify voltage (VVFY) applied to said control gate during verify operation, based on said input analog voltage; a write memory cell drain voltage generation circuit (VW voltage generation circuit 125) which generates a write memory cell drain voltage (VW voltage) during write operation, said write memory cell drain voltage is changed by varying the gain of a non-inverting amplifier; a multi-level sense amplifier (240) which compares the memory cell drain current with the specific current mirror current of the reference comparison current during verify operation; a counter decoder circuit (150) which outputs a signal equivalent to a predetermined number of write pulses to said memory cell; a comparison circuit (160) which compares the output of said multi-level sense amplifier with the output of said counter decoder; and an up-down shift register circuit (170) which shifts the level of said control signals based on a comparison result of said comparison circuit.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIG. 22 shows a graph showing a Vcg-Ids characteristic of a memory cell and descriptions describing the output relation between Vcg-Ids characteristic and output SAOUT0 at the time of the write operation in the third and fourth embodiments of the invention.

DETAILED DESCRIPTION OF THE PREFERRED EMBODIMENTS

Figure 1:
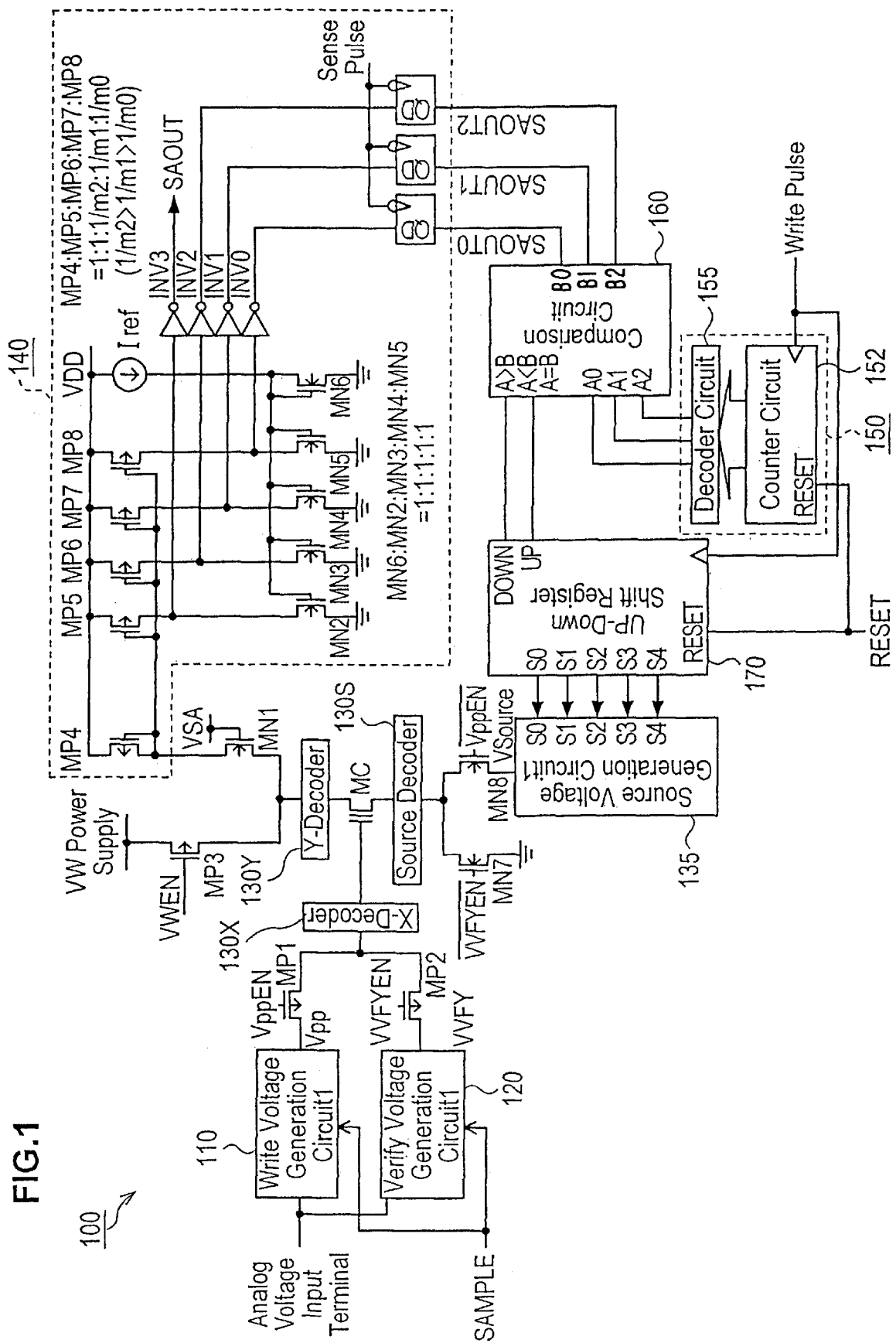
FIG. 1 is a circuit diagram of the first embodiment according to the invention.

A circuit for writing an analog voltage to a non-volatile memory (referred to as merely 'write circuit' hereinafter) according to the invention will now be described in detail by way of preferred embodiments according to the invention with reference to the accompanying drawings. In the accompanying drawing, FIGS. 1, 7, 8, 11, 12, 14, 16, and 17 illustrate write circuits according to respective embodiments of the invention while FIGS. 18, 21~23 shows timing charts for describing the operations of respective embodiments according to the invention. In the specification and drawings, constituents of the invention playing a substantially like function carry a like reference numeral or sign. Furthermore, it is defined that a capital letter 'H' stands for a high level potential while a capital letter 'L' stands for a low level potential.

[First Embodiment]

FIG. 1 is a circuit diagram of a write circuit 100 according to the first embodiment of the invention. This write circuit 100 includes a write voltage generation circuit 110 generating a write voltage Vpp in response to the value of an analog voltage as inputted, the write voltage Vpp being impressed on the control gate of the memory cell at the time of the write operation, and a verify voltage generation circuit 120 generating a verify voltage VVFY, which is impressed on the control gate of the memory cell at the time of the verify operation.

Furthermore, the write circuit 100 includes an X-decoder 130X, a Y-decoder 130Y and a source decoder 130S, all of which are used for selecting a memory cell to be written, a p-channel metal oxide semiconductor (referred to as 'PMOS' hereinafter) MP1 conducting the write voltage Vpp to the X-decoder 130X at the time of the write operation, a PMOS MP2 conducting the verify voltage VVFY to the X-decoder at the time of the verify operation, a PMOS MP3 conducting a write memory cell drain voltage VW to the Y-decoder 130Y at the time of the write operation, an n-channel oxide metal semiconductor (referred to as 'NMOS' hereinafter) MN8 conducting a source voltage VSource to the source decoder 130S at the time of the write operation, an NMOS MN7 conducting a ground (GND) potential to the source decoder 130S at the time of the verify operation, a source voltage generation circuit 135 generating a source voltage VSource to be imposed on the source of memory cell at the time of the write operation, and a source follower NMOS transistor MN1 conducting the drain voltage to Y-decoder 130Y preventing the read disturb of the memory cell at the time of the write operation.

The write circuit 100 still further includes a multi-level sense amplifier 140 comparing the memory cell drain current with a reference current for comparison (referred to as 'reference comparison current' hereinafter) Iref at the time of the verify operation, the multi-level sense amplifier 140 made up of MP4~MP8, MN2~MN6 and INV0~INV3, a counter decoder circuit 150 outputting a predetermined number of write signal pulses, a comparison circuit 160 comparing the outputs SAOUT0~SAOUT2 of the multi-level sense amplifier 140 with the outputs A0~A2 from the counter decoder 150, respectively, and an up-down shift register circuit 170 shifting the outputs S0~S4 (i.e. the first control signals) in the dual directions MSB/LSB (Most Significant Bit/Least Significant Bit) based on the comparison result of the comparison circuit 160. The outputs S0~S4 from the up-down shift register circuit 170 are inputted to the source voltage generation circuit 135. The write circuit 100 is made up as described above.

Figure 2:
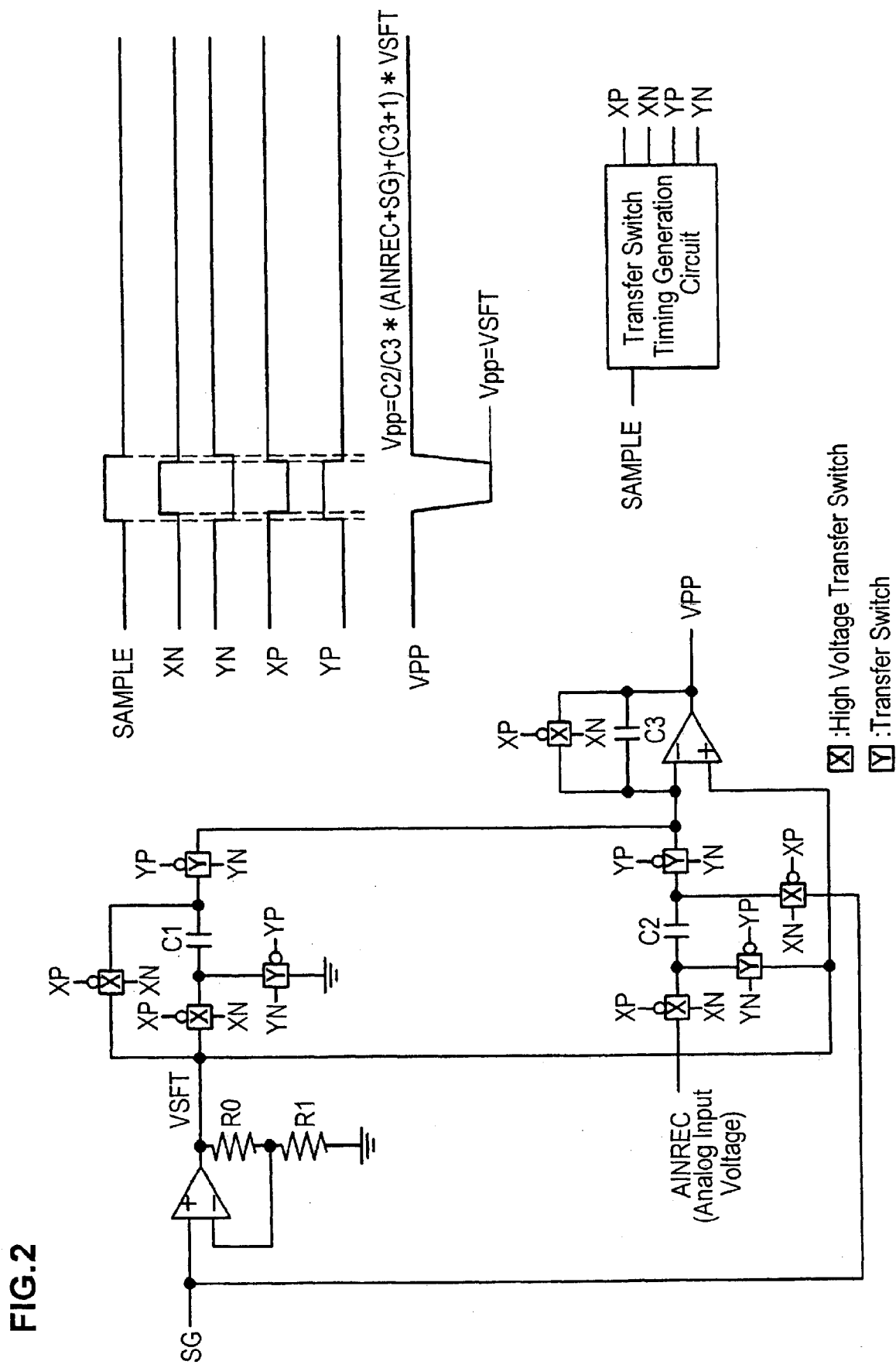
FIG. 2 shows diagrams including a circuit diagram of a write voltage generation 1, a timing chart of a signal SAMPLE, and a block diagram of a timing generation circuit in connection with the first, second, and fourth embodiments according to the invention.

FIG. 2 shows a circuit diagram of the write voltage generation circuit 110. This write circuit 110 is a sample hold level shift circuit and the shift amount (gain) thereof is kept at a constant value.

Figure 3:
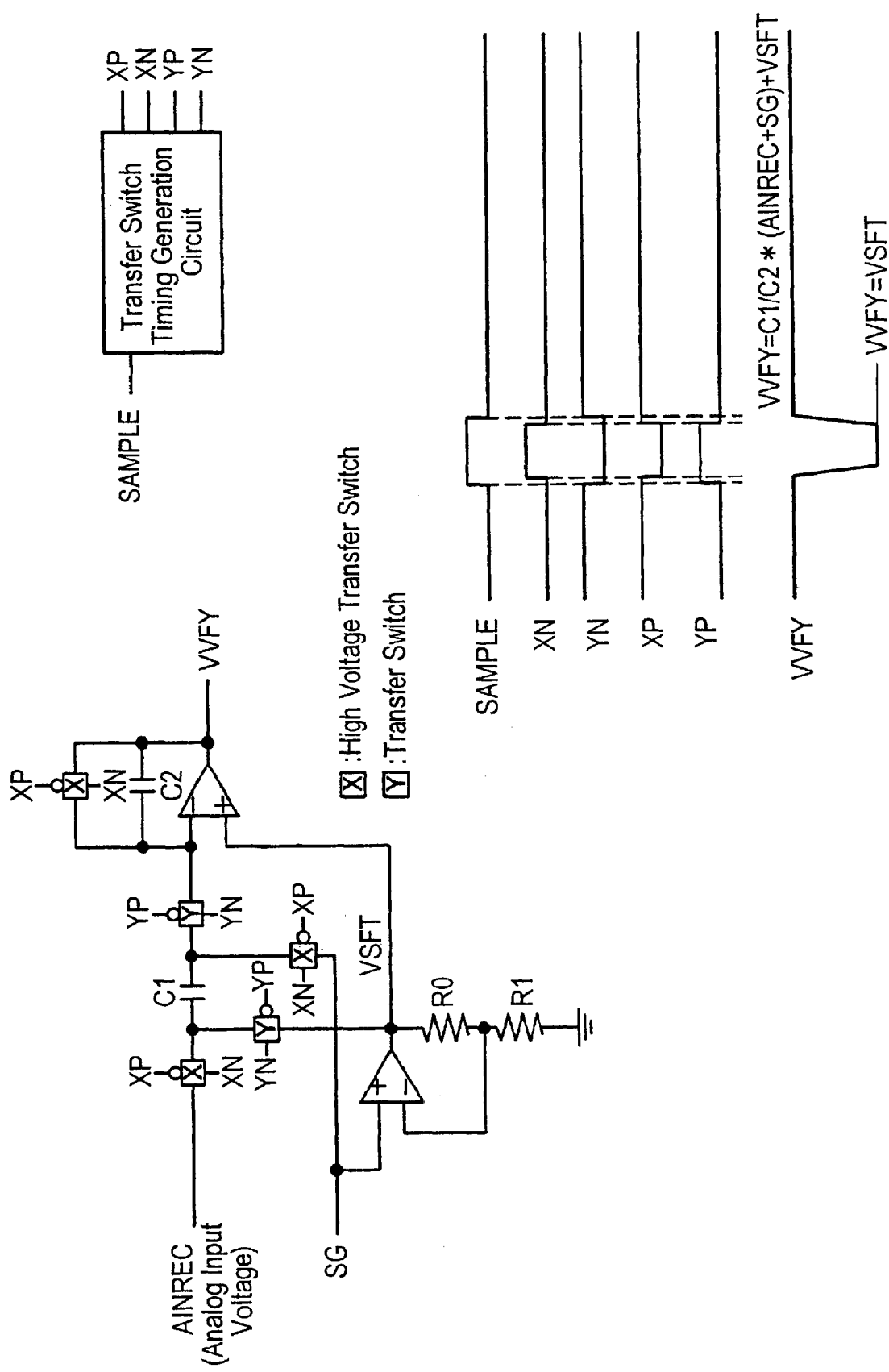
FIG. 3 shows diagrams including a verify voltage generation circuit 1, a timing chart of a signal SAMPLE, and a block diagram of a timing generation circuit relating in common to the first through eighth embodiments according to the invention.

FIG. 3 shows a circuit diagram of the verify voltage generation circuit 120. This verify generation circuit 120 is also a sample hold level shift circuit and the shift amount (gain) thereof is kept at a constant value.

Figure 4:
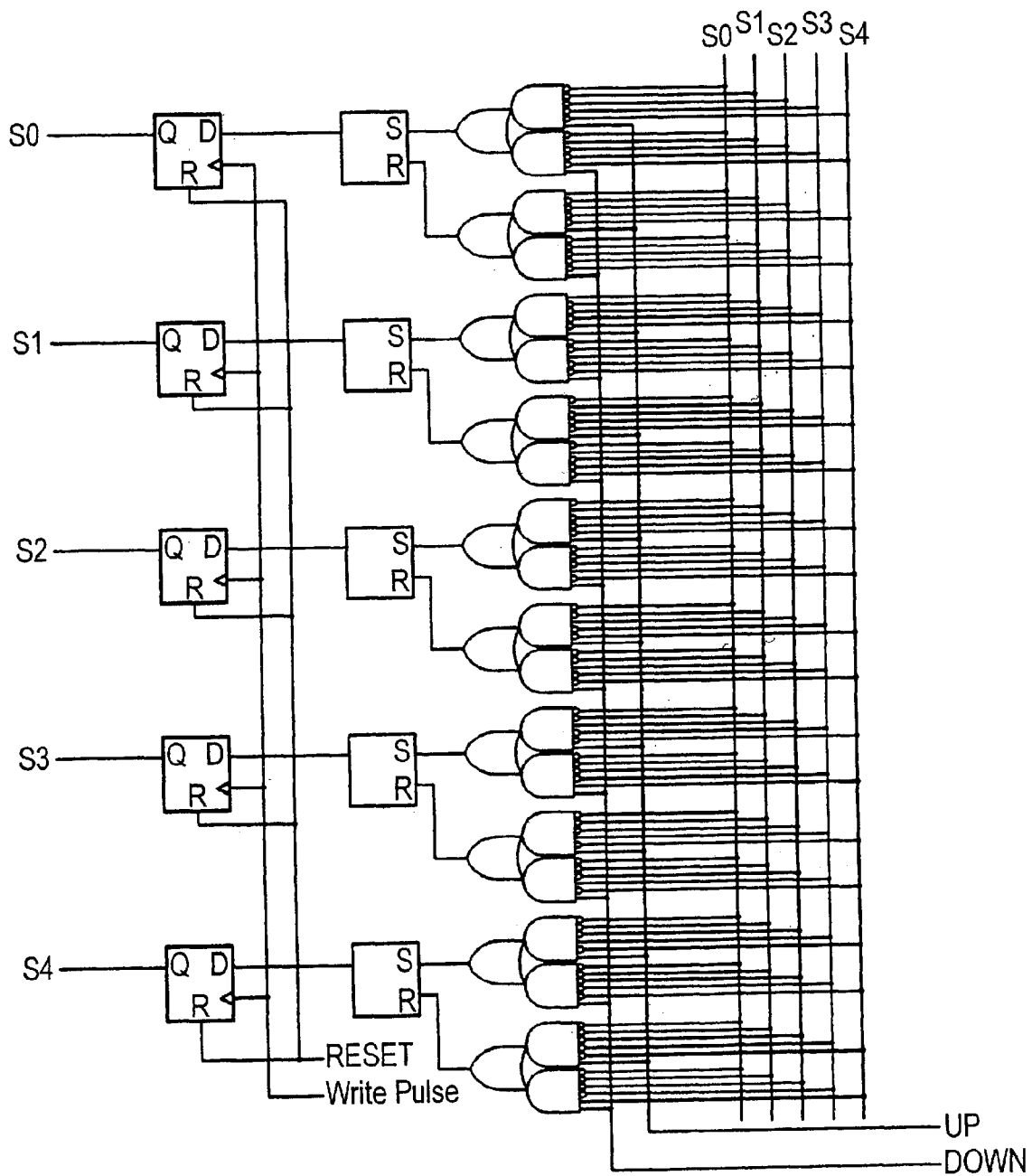
FIG. 4 is a circuit diagram an up-down shift register circuit relating in common to the first through eighth embodiments according to the invention.

FIG. 4 shows a circuit diagram of the up-down shift register circuit 170.

Figure 5:
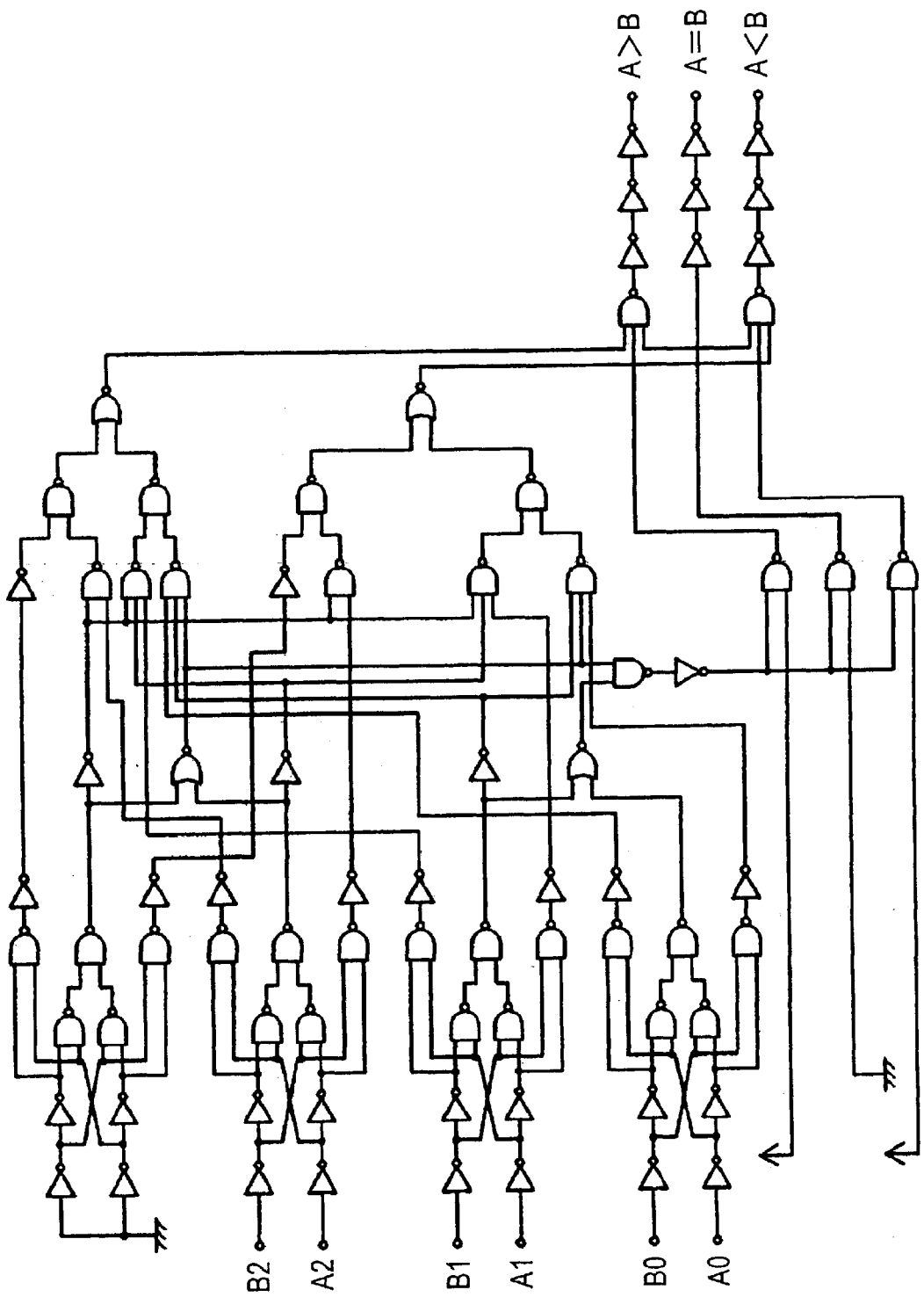
FIG. 5 is a circuit diagram of a comparison circuit relating to the first, second, fifth through eighth embodiments according to the invention.

FIG. 5 shows a circuit diagram of the comparison circuit 160.

Figure 6:
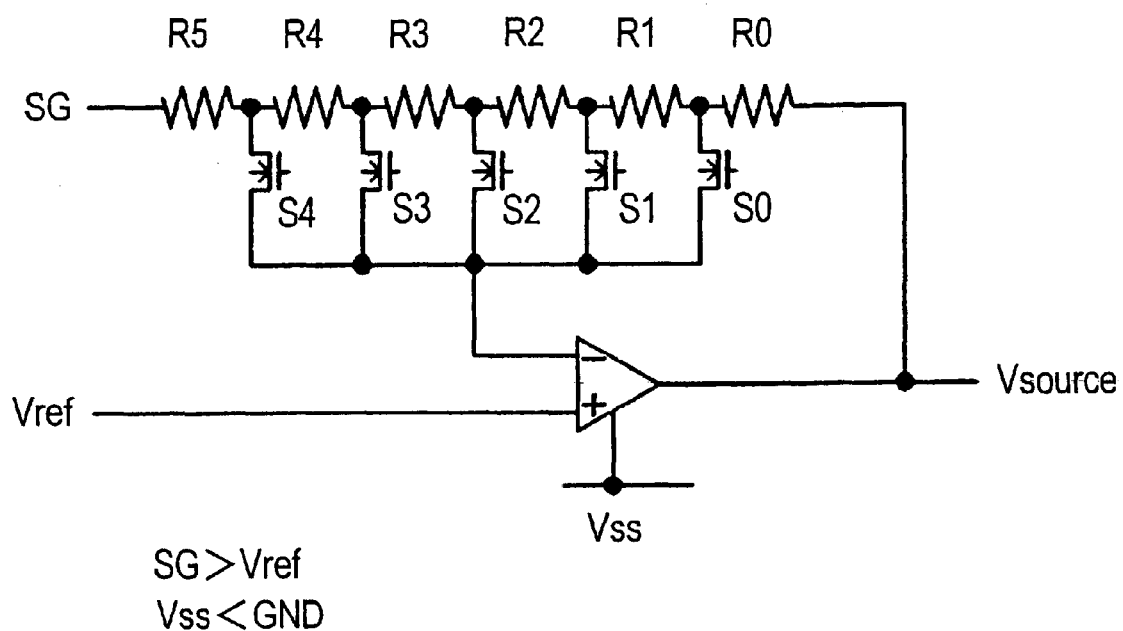
FIG. 6 is a circuit diagram of a source voltage generation circuit 1 relating to first, second, and fourth embodiments according to the invention.

FIG. 6 shows a circuit diagram of the source voltage generation circuit 135. This source voltage generation circuit 135 is formed as an inverting amplifier characterized in that it can vary the gain of the inverting amplifier in response to the inputs S0~S4 thereto, thereby enabling the output source voltage VSource to vary.

Figure 18:
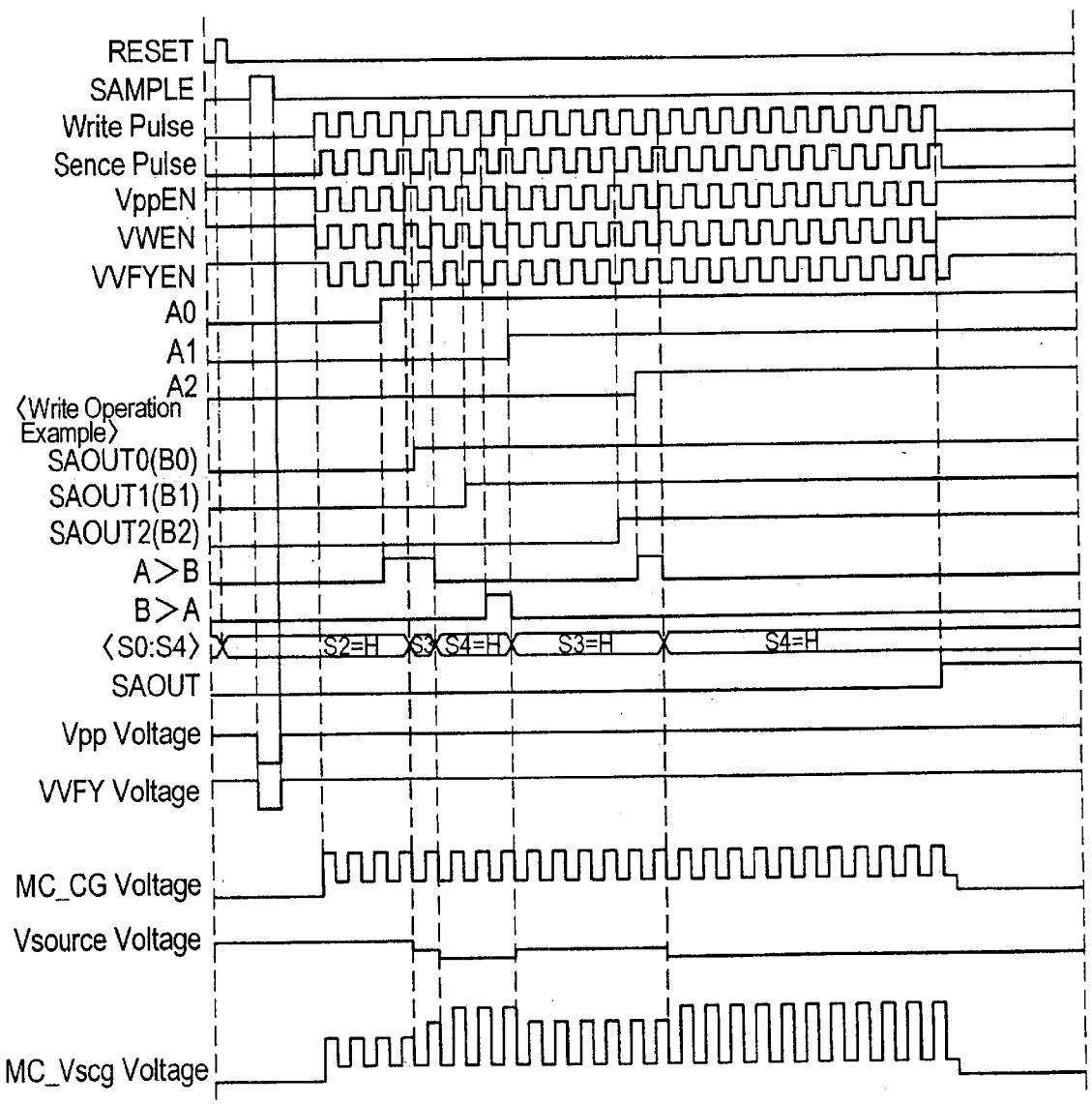
FIG. 18 is a timing chart for explaining the operation of the first and second embodiments according to the invention.

FIG. 18 shows a timing chart for explaining the operation of the first embodiment according to the invention. A write target memory cell treated by means of the erase operation is selected by the X-decoder 130X, the Y-decoder 130Y and the source decoder 130S. Then, the counter circuit 152 and the up-down shift register circuit 170 are reset with a reset pulse RESET. At this time, the output S2 of the up-down shift register circuit 170 in the reset state is at the level of H.

With the input of a signal SAMPLE, the sample-hold and level-shift operations of an input analog voltage are carried out by the write voltage generation circuit 110 and the verify voltage generation 120 as well, thereby the write voltage Vpp and the verify voltage VVFY being generated, respectively. At this time, the input analog voltage value AINREC has the following relation with the write voltage Vpp and the verify voltage VVFY, that is:

$$Vpp = C2/C3 \times (AINREC - SG) + (C1/C3 + 1) \times VSFT$$

$$VFFY = C1/C2 \times (AINREC - SG) + VSFT$$

where

VSFT: reference voltage for write voltage Vpp

SG: reference voltage for input voltage AINREC

C1, C2, and C3: condenser capacitance

The write/verify operation begins when the clock signal corresponding to the write pulse and the enable signals VppEN, VWEN and VVFYEN are given to the counter circuit 152, the up-down shift register circuit 170, PMOS's MP1, MP2 and MP3, and NMOS's MN and MN8, respectively.

Figure 19:
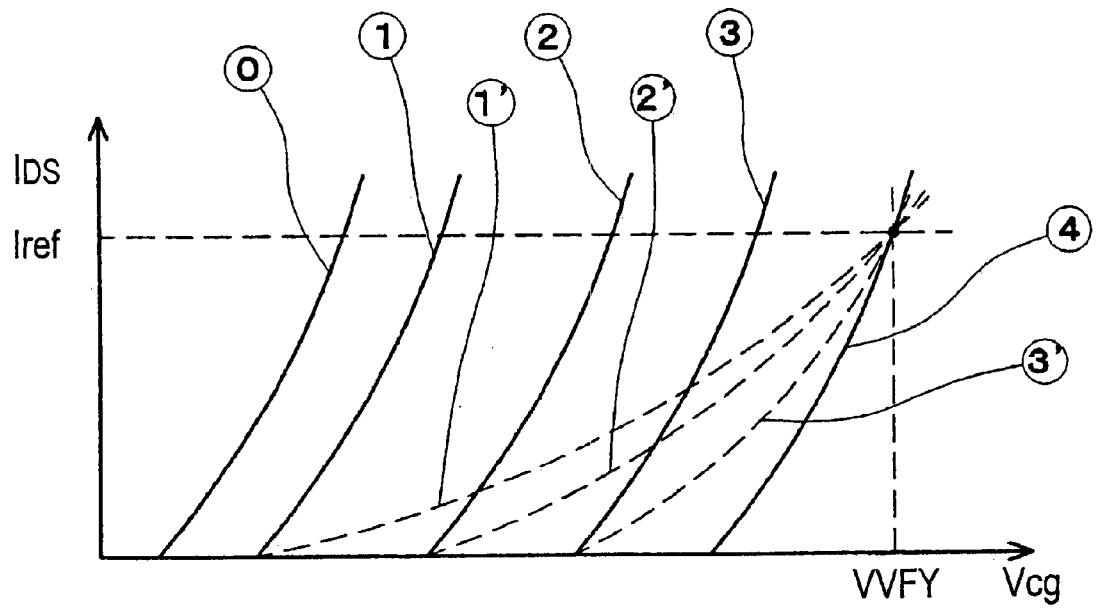
FIG. 19 includes a graph showing a Vcg-Ids characteristic and descriptions describing the output relation between Vcg-Ids characteristic and output SAOUT0~SAOUT2 at the time of the write operation in the first, fifth and sixth embodiments of the invention.

FIG. 19 includes a graph showing the Vcg-Ids characteristic of the memory cell and descriptions describing the output relation between the Vcg-Ids characteristic and the outputs SAOUT0~ASOUT2 at the time of the write operation according to the first embodiment. The Vcg-Ids characteristic is varied as shown by curves (0)~(4) with the rise of the memory cell threshold value Vt, which is caused by repeating the write/verify operation. In the first embodiment, the memory cell drain current is compared with the reference comparison current Iref, at the time of the verify operation, varying the memory cell drain current by means of a current mirror circuit consisting of PMOS's MP4~MP8.

Since the driving power ratio between PMOS's MP4, MP5, MP6, MP7 and MP8 is set as MP4:MP5:MP6:MP7:MP8=1:1:1/m2:1/m1:1/m0 (1>1/m2>1/m1>1/m0), if the Vcg-lds characteristic is varied with rise of the memory cell threshold value Vt as shown in by the curves (0)~(4), the sense amplifying inverters INV0~INV3 are L-H inverted in the order of INV0, INV1, and INV2, and the outputs SAOUT0~SAOUT2 of the multi-level sense amplifier 140 are also L-H inverted in the order of SAOUT0, SAOUT1, and SAOUT2. The rising speed of the memory cell threshold value Vt is determined based on the memory cell characteristic and the source-control gate voltage at the time of the write operation.

At the start of the write operation, all the outputs A0~A2 of the decoder circuit 155 are set to be at L level. Then, after having started the write operation, these outputs A0~A2 are L-H inverted in the order of A0, A1 and A2 depending on the number of write pulses (i.e. write period of time).

At the start of the write operation, the write voltage Vpp (constant) and the source voltage VSource as set initially are respectively expressed as follows.

$$Vpp = C2/C3 \times (AINREC-SG) + (C1/C3+1) \times VSFT$$

$$VSource = (R0+R1+R2)/(R3+R4+R5) \times (SG-Vref) + Vref$$

where

Vref: reference voltage of inverting amplifier

VSFT: reference voltage for write voltage Vpp

SG: reference voltage for input voltage AINREC

C1~C3: condenser capacitance

R0~R5: gain resistance

Accordingly, the voltage difference between the source and control gate of the selected memory cell at the start of the write operation is expressed as follows.

$$Vpp(\text{constant}) - VSource = [C2/C3 \times (AINREC-SG) + (C1/C3+1) \times VSFT] - [(R0+R1+R2)/(R3+R4+R5) \times (SG-Vref) + Vref]$$

This voltage difference becomes the voltage between the source and control gate of the selected memory cell at the time of the write operation, and is written to the selected memory cell, thereby the memory cell threshold value Vt being raised.

At the time of the verify operation, the outputs SAOUT0~SAOUT2 of the multi-level sense amplifier circuit 140 are compared with the outputs A0~A2 of the decoder circuit by the comparison circuit 160, and the output of the up-down shift register circuit 170 is varied according to the result of this comparison, and the source voltage VSource is varied in turn.

If the output SAOUT0 is L-H inverted before the output A0 is L-H inverted, the output A<B of the comparison circuit 160 is L-H inverted, by which the output S2=H of the up-down shift register circuit 170 is shifted to S1=H, and the source voltage VSource is increased as expressed in the following:

$$VSource = -(R0+R1)/(R2+R3+R4+R5) \times (SG-Vref) + Vref$$

and the voltage between the source and the control gate of the selected memory sell is decreased at the time of the write operation.

Contrary to this, if the output A0 is L-H inverted before the output SAOUT0 is L-H inverted, the output A>B of the comparison circuit 160 is L-H inverted, by which the output S2=H of the up-down register circuit 170 is shifted to S3=H, and the source voltage VSource is decreased as expressed in the following:

$$VSource = -(R0+R1+R2+R3)/(R4+R5) \times (SG-Vref) + Vref$$

and the voltage difference between the source and the control gate of the selected memory sell is increased at the time of the write operation.

The timing chart shown in FIG. 18 indicates the write operation in which the output A0 is L-H inverted before the output SAOUT0 is L-H inverted.

Similarly to the above, if the outputs of A1 and A2 of the decoder circuit 155 is L-H inverted in the order thereof according to the number of write pulses (write period of time), the outputs SAOUT0~SAOUT2 of the multi-level sense amplifier circuit 140 are compared with the outputs A0~A2 of the decoder 155 by means of the comparison circuit 160 at the time of the verify operation and, the output of the up-down shift register circuit 170 is made to vary with result of this comparison, and in turn, the source voltage VSource is made to vary.

Accordingly, if the ratio coefficient between the number of write pulses (write period of time) causing the L-H inversion of the outputs A0~A2 of the decoder circuit 155 and the driving power ratio between PMOS's MP4, MP5, MP6, MP7 and MP8 forming the current mirror circuit of the multi-level sense amplifier circuit 140, that is, MP4:MP5:MP6:MP7:MP8=1:1:1/m2:1/m1:1/m0 (1>1/m2>1/m1>1/m0), is typically adjusted so as to meet the write time vs. memory cell threshold value Vt characteristic of the selected memory cell, the write operation can be continued seeking the suitable write condition (the suitable voltage impressed between the source and control gate of the selected memory cell at the time of the write operation) meeting the write characteristic of the selected memory cell. In other words, if the memory cell has a slow write speed, the increased voltage may be impressed between the source and control gate thereof. Contrarily to this, if the memory cell has a fast write speed, the decreased voltage may be impressed between the source and control gate thereof.

When the drain current of the memory cell has become equal to or less than the reference comparison current Iref, the output SAOUT is inverted to the level H, thereby the write operation of the selected memory cell being terminated.

As described above, according to the first embodiment of the invention, the outputs A0~A2 of the decoder circuit 155 is L-H inverted in the order of A0, A1 and A2 according to the number of the write pulses (write period of time). Furthermore, the outputs SAOUT0~SAOUT2 from the multi-level sense amplifier 140 are L-H inverted in the order of SAOUT0, SAOUT1 and SAOUT2 according to the rise of the memory cell threshold value Vt. Then, these two outputs are compared with each other by the comparison circuit 160, in response to the comparison result of which the write source voltage VSource is made to vary. Therefore, according to the first embodiment, the source-control gate voltage of the memory cell can be increased at the time of the write operation with respect to the memory cell having a slow write speed. Contrary to this, the source-control gate voltage of the memory cell can be decreased at the time of the write operation with respect to the memory cell having a fast write speed. This means that the write operation can be carried out looking for the most suitable write condition (suitable source-control gate voltage of the memory cell) meeting the write characteristic of the selected memory cell.

Accordingly, even if the memory cell has an initial write speed which is made slow from the beginning or made slow due to the endurance deterioration, the analog voltage write operation can be terminated within a predetermined period of time without lowering the write accuracy of the analog voltage. Furthermore, even if the memory cell has a fast initial write speed, the final analog voltage write can be carried out with the saturated threshold value Vt, thereby unevenness in the write accuracy of the analog voltage being well corrected.

Furthermore, according to the first embodiment, the reference voltage Vref and the gain resistances R0~R5 of the inverting amplifier can be set such that the output source voltage VSource of the source voltage generation circuit 135 is equal to or higher than the ground potential GNP. Therefore, even if an memory cell as excessively erased is included in non-selected memory cells as normally erased, which are lying along the same bit line as the memory cell selected for write, it is possible to make the source voltage VSource of the excessively erased memory cell be equal to or higher than the ground potential GNP, so that the Ids leakage in the excessively erased memory cell can be prevented. Accordingly, it becomes unnecessary to take any countermeasure with respect to the excessively erased memory cell, for instance, the countermeasure of making the current capacity of the VW power source generating the write drain voltage larger than the write current Ids of the selected memory cell. If the VW power source is made up of an LIS internal booster circuit, the increase of the current consumption can be suppressed.

Contrary to the above, the reference voltage Vref and the gain resistances R0~R5 of the inverting amplifier can be set such that the output source voltage VSource of the source voltage generation circuit 135 is lower than the ground potential GNP. In this case, it is possible to lower the write voltage Vpp (constant) i.e. the voltage impressed on the control gate of the memory cell at the time of the write operation. Furthermore, in this case, the voltage impressed on the control gate of the non-selected memory cell lying along the same word line as the selected memory cell for write is also lowered, so that the gate disturbance can be reduced.

As described above, according to the first embodiment, in case of the memory in which the excessively erased memory cell is apt to take place, the output source voltage VSource of the source voltage generation circuit 135 can be set to be equal to or higher than the ground potential GNP, so that the Ids leakage of the excessively erased memory cell can be prevented. Furthermore, with respect to the memory cell which is apt to receive the gate disturbance, the output source voltage VSource of the source voltage generation circuit 135 is set to be lower than the ground potential GNP, thereby lowering the write voltage Vpp. With this, the gate disturbance can be prevented.

[Second Embodiment]

Figure 7:
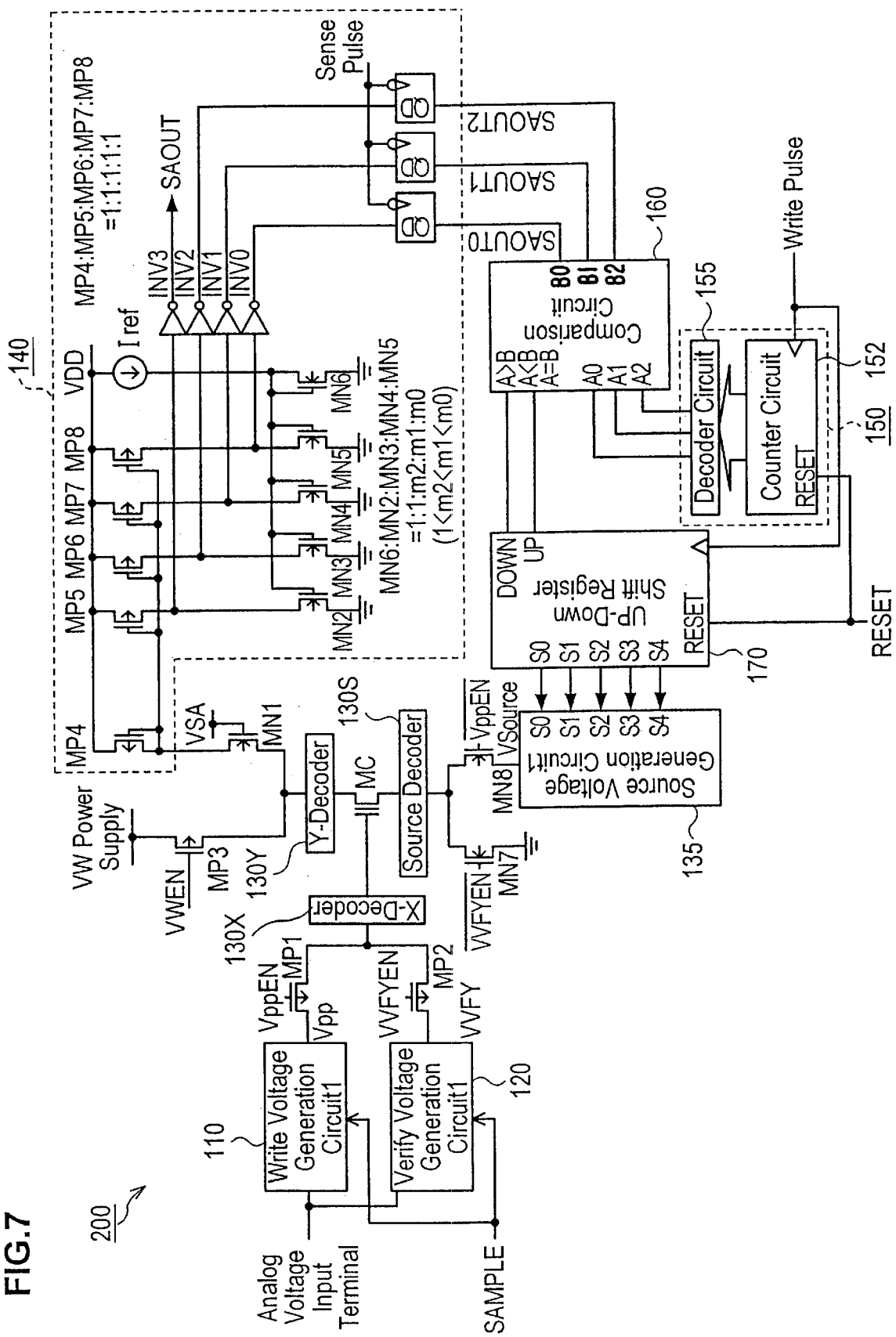
FIG. 7 is a circuit diagram of the second embodiment according to the invention.

FIG. 7 shows a circuit diagram of a write circuit 200 according to the second embodiment of the invention. This write circuit 200 has a circuit structure basically similar to that of the write circuit 100 except that the driving power ratio of PMOS's MP4~MP8 and NMOS's MN2~MN6 making up of the multi-level sense amplifier 140 is different from the driving power ratio of PMOS's MP4~MP8 and NMOS's MN2~MN6 of the write circuit 100. In the second embodiment, the driving power ratio of the above PMOS's and NMOS's is set as MP4:MP5:MP6: MP7:Mp8= 1:1:1:1:1, and MN6:MN2:MN3:MN4:MN5=1:1:m2:m1:m0 (1<m2<m1<m0).

FIG. 18 is a timing chart explaining the operation of the write circuit 200 according to the second embodiment. The basic operation of the write circuit 200 is basically similar to the write circuit 100 of the first embodiment. The different point is that the output relation between Vcg-Ids characteristic and the outputs SAOUT0~ASOUT2 at the time of the write operation in the first embodiment as shown in FIG. 19, is changed to that which is shown in FIG. 20.

Figure 20:
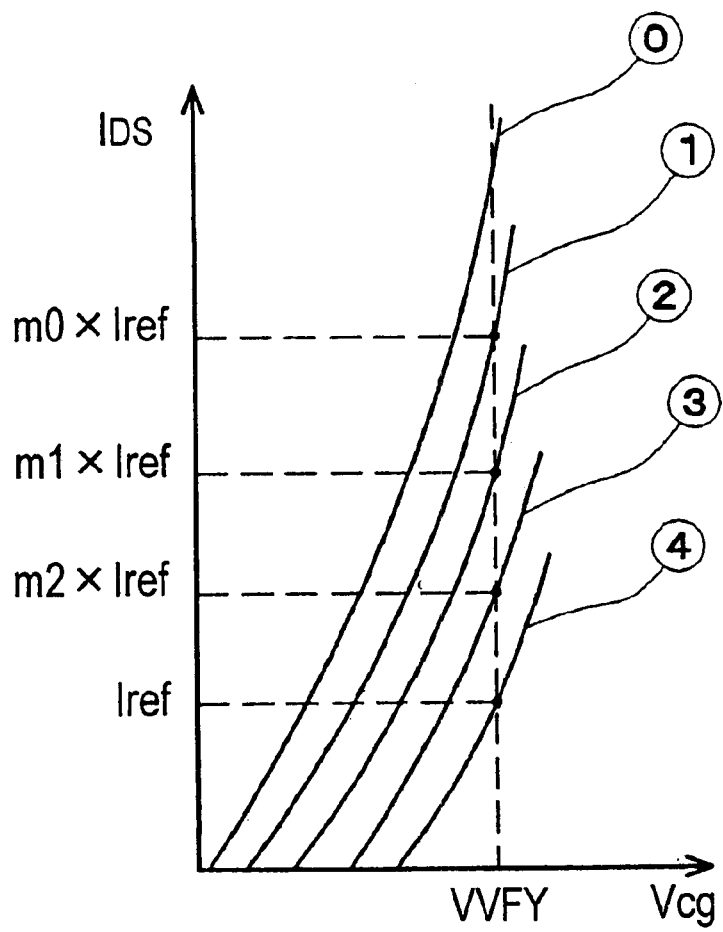
FIG. 20 shows a graph showing a Vcg-Ids characteristic of a memory cell and descriptions describing the output relation between Vcg-Ids characteristic and output SAOUT0~SAOUT2 at the time of the write operation in the second, seventh and eighth embodiments of the invention.

As shown in FIG. 20, the circuit operation according to the second embodiment is similar to that of the first embodiment. That is, the Vcg-Ids characteristic of the memory cell is also varied as indicated by curves (0)~(4) shown in FIG. 20 with the rise of the memory cell threshold value Vt while the write/verify operation is being repeated. However, the second embodiment is different from the first embodiment in that at the time of the verify operation, the memory cell drain current is compared not with the reference comparison current Iref but with a reference comparison current Iref' which is obtained by changing the reference comparison current Iref by means of the current mirror circuit made up of NMOS's MN2~MN6.

Since the driving power ratio of NMOS's MN2~MN6 is set as MN6:MN2:MN3:MN4:MN5=1:1:m2:m1:m0 (1<m2<m1<m0), if the Vcg-Ids characteristic is varied with rise of the memory cell threshold value Vt as shown by the curves (0)~(4), the sense amplification inverters INV0, INV1, INV2 and INV3 are L-H inverted in the order thereof, and the outputs SAOUT0, SAOUT1 and SAOUT2 of the multi-level sense amplifier 140 are also L-H inverted in the order thereof. The rising speed of the memory cell threshold value Vt is determined based on the memory cell characteristic and the write voltage Vpp at the time of the write operation. Accordingly, with respect to these points, the operation of the write circuit 200 is similar to that of the write circuit 100.

In the second embodiment, similar to the first embodiment, the outputs A0, A1 and A2 of the decoder 150 are L-H inverted in the order thereof according to the number of write pulses (write period of time) while the outputs SAOUT0, SAOUT1 and SAOUT2 of the multi-level sense amplifier 140 are also L-H inverted in the order thereof with the rise of the memory cell threshold value Vt. These two kinds of the L-H inverted outputs are compared with each other by the comparison circuit 160, and the write source voltage VSource is varied in response to the comparison result by the comparison circuit 160. Therefore, the source-control gate voltage of the memory cell can be increased when executing the write operation with respect to the memory cell having a slow write speed and, contrary to this, can be decreased when executing the write operation in respect of the memory cell having a fast write speed. This means that the write operation can be carried out looking for the most suitable write condition (the suitable source-control gate voltage of the memory cell) meeting the write characteristic of the selected memory cell.

Accordingly, even if the memory cell has an initial write speed which is made slow at the first or made slow due to due to the endurance deterioration, the analog voltage write operation can be terminated within a predetermined period of time without lowering the write accuracy of the analog voltage. Furthermore, even if the memory cell has a fast initial write speed, the final write of the analog voltage can be made in the saturation state of the memory cell threshold value Vt, so that unevenness in the write accuracy of the analog voltage can be well corrected.

In the source voltage generation circuit 135, the reference voltage Vref and the gain resistances R0~R5 of the inverting amplifier can be set such that the output source voltage VSource is equal to or higher than the ground potential GNP. Therefore, even if an memory cell as excessively erased is included in non-selected memory cells as normally erased, which are lying along the same bit line as the memory cell selected for write, it is possible to make the source voltage VSource of the excessively erased memory cell be equal to or higher than the ground potential GNP, so that the Ids leakage in the excessively erased memory cell can be prevented. Accordingly, it becomes unnecessary to take any countermeasure with respect to the excessively erased memory cell, for instance, the countermeasure of making the current capacity of the VW power source generating the write drain voltage larger than the write current Ids of the selected memory cell for write. If the VW power source is made up of an LIS internal booster circuit, the increase of the current consumption can be suppressed.

Contrary to the above, the reference voltage Vref and the gain resistances R0~R5 of the inverting amplifier can be set such that the output source voltage VSource of the source voltage generation circuit 135 is lower than the ground potential GNP. In this case, it is possible to lower the write voltage Vpp (constant) i.e. the voltage impressed on the control gate of the memory cell at the time of the write operation. Furthermore, in this case, the voltage impressed on the control gate of the non-selected memory cell lying along the same word line as the selected memory cell for write is also lowered, so that the gate disturbance can be reduced.

As discussed above, in case of the memory in which the excessively erased memory cell is apt to take place, the output source voltage VSource of the source voltage generation circuit 135 can be set to be equal to or higher than the ground potential GNP, so that the Ids leakage of the excessively erased memory cell can be prevent. With respect to the memory cell which is apt to receive the gate disturbance, the output source voltage VSource of the source voltage generation circuit 135 is set to be lower than the ground potential GNP. With this, the write voltage Vpp is lowered, thereby the gate disturbance being prevented.

Furthermore, since the multi-level sense amplifier 140 of the write circuit 200 according to the second embodiment changes the driving power ratio of NMOS's making up of the current mirror circuit, to the ratio MN6:MN2:MN3:MN4:MN5=1:1:m2:m1:m0 (1<m2<m1<m0), the verification operation carried out by the inverters INV0~INV2 on the way of the write process is executed by using the reference comparison current Iref' larger than the reference comparison current Iref. With this, it becomes possible to get speed up the verification operation by the inverters INV0~INV2 on the way of the write process in comparison with the verification operation using the reference comparison current Iref. In other words, the multi-level sense amplifier in the second embodiment becomes a high speed multi-level sense amplifier 140. Therefore, according to the second embodiment, it becomes possible to shorten the time corresponding to the response time of the multi-level sense amplifier within the time of the memory cell verify operation carried out in the verify duration of the repetitive write/verify operation. This is advantageous and effective when executing the write operation using the high frequency write pulse.

Since the verification operation carried out with the inverters INV0~INV2 on the way of the write operation is executed by using the reference comparison current Iref' larger than the reference comparison current Iref, it is needed for PMOS's (MP4~MP8) of which the current mirror circuit of the multi-level sense amplifier 140 is made up, to be evenly provided with a dimension allowing the above PMOS' to operate in the saturated area with the Ids of MN5 using the largest Iref'. In case of forming this circuit in the process of □p>□n in according to the second embodiment, the circuit can be achieved without making each dimension of PMOS's (MP4~MP8) larger than that of MN5. Accordingly, the layout area can be made smaller comparing with the case of forming this circuit in the process of □p<□n.

[Third Embodiment]

Figure 8:
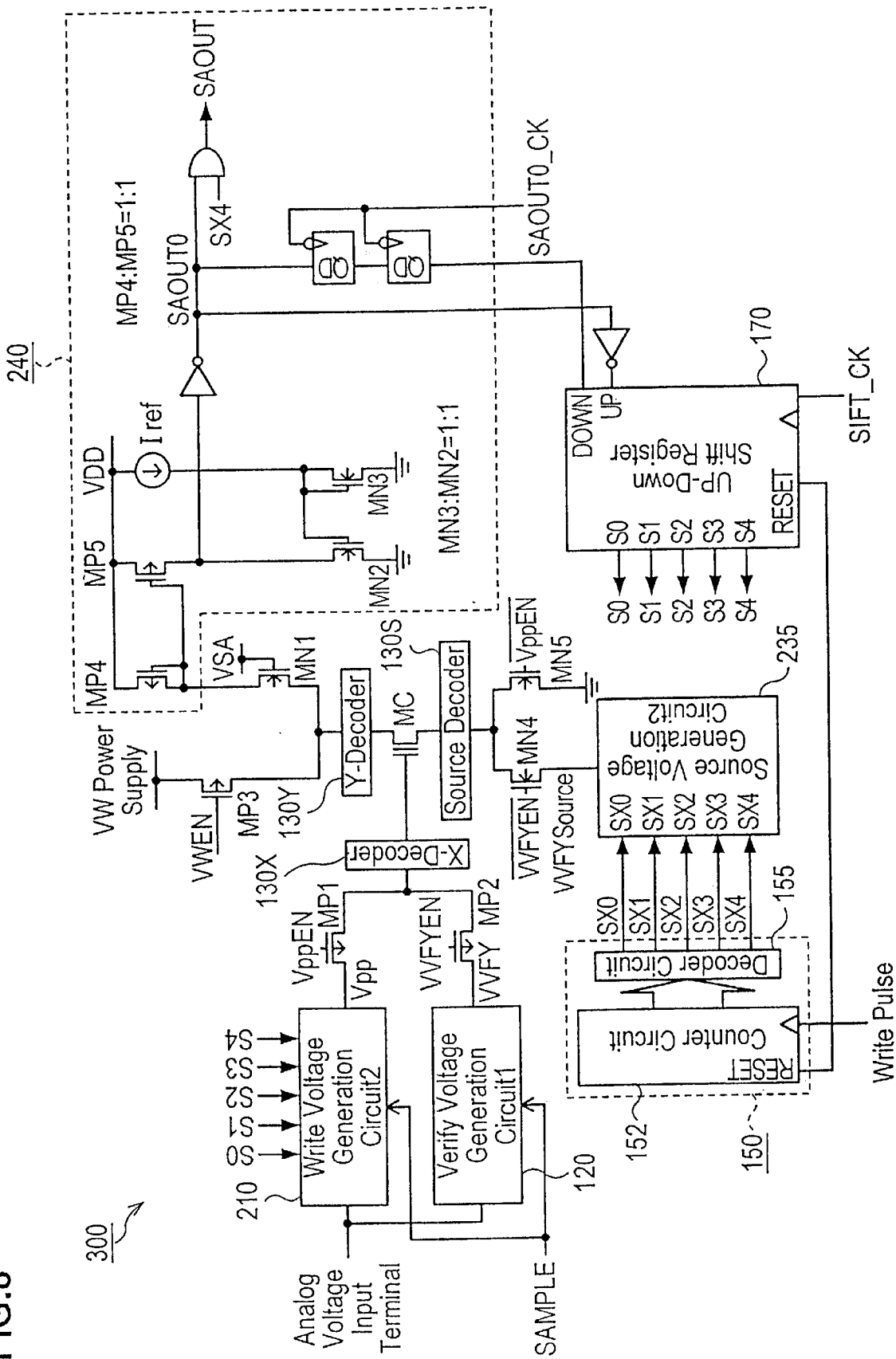
FIG. 8 is a circuit diagram of the third embodiment according to the invention.

FIG. 8 is a circuit diagram of a write circuit according to the third embodiment of the invention. This circuit 300 includes a write voltage generation circuit 210 generating a write voltage Vpp based on an analog voltage as inputted, the write voltage Vpp being impressed on the control gate of the memory cell at the time of the write operation, and a verify voltage generation circuit 120 generating a verify voltage VVFY, which is impressed on the control gate of the memory cell at the time of the verify operation.

Furthermore, the write circuit 300 includes an X-decoder 130X, a Y-decoder 130Y and a source decoder 130S, all of which are used for selecting a memory cell to be written, a PMOS MP1 conducting the write voltage Vpp to the X-decoder 130X at the time of the write operation, a PMOS MP2 conducting the verify voltage VVFY to the X-decoder at the time of the verify operation, a PMOS MP3 conducting a write memory cell drain voltage VW to the Y-decoder 130Y at the time of the write operation, an NMOS MN5 conducting a ground voltage GND to the source decoder 130S at the time of the write operation, an NMOS MN4 conducting the a verify source voltage VVFYSource to the source decoder 130S at the time of the verify operation, a source voltage generation circuit 235 generating a verify source voltage VVFYSource to be impressed on the source of the memory cell at the time of the verify operation, and a source follower NMOS MN 1 conducting the drain voltage to the Y-decoder 130Y for preventing the read disturb of the memory cell at the time of the verify operation.

The write circuit 300 still further includes a sense amplifier 240 comparing the memory cell drain current with the reference comparison current Iref at the time of the verify operation, the sense amplifier 240 made up of PMOS's MP4 and MP5, NMOS's MN2 and MN3 and a inverter INV0, a counter decoder circuit 150 outputting a signal when the number of write signal pulses has reached a predetermined value, and an up-down shift register circuit 170 shifting outputs S0~S4 to dual directions MSB/LSB based on the output SAOUT0 of the sense amplifier 240. The outputs S0~S4 from the up-down shift register circuit 170 are inputted to the write voltage generation circuit 110. The outputs SX0~SX4 (the second control signals) of the counter decoder circuit 150 are also inputted to the write voltage generation circuit 110.

The write circuit 300 is formed as described above.

Figure 9:
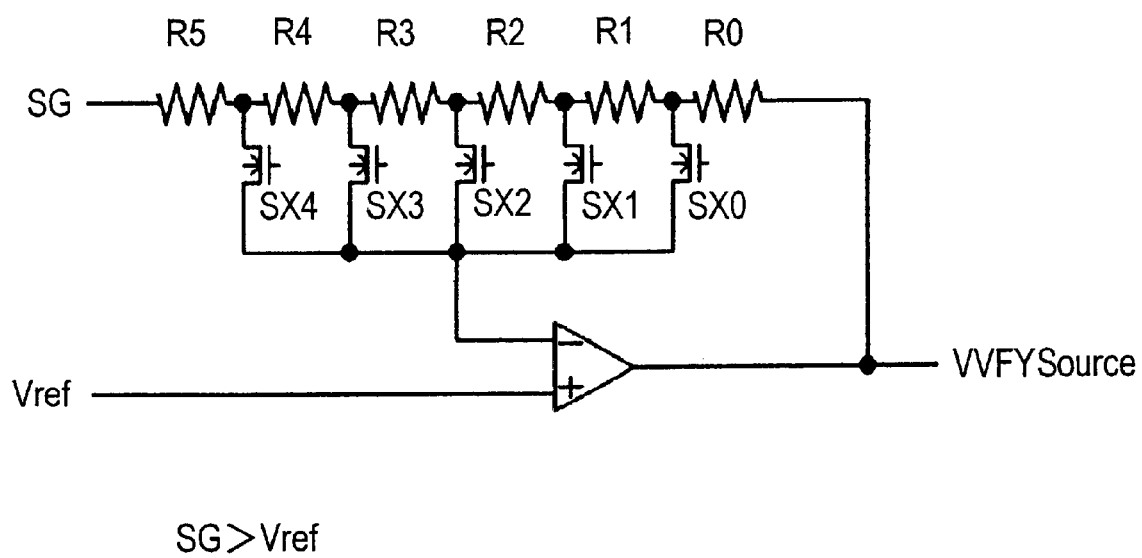
FIG. 9 is a circuit diagram for a source voltage generation circuit 2 relating to the third and fourth embodiments according to the invention.

The write circuit 300 is characterized in that the source voltage generation circuit 135 having been used in the write circuits 100 and 200 is replaced by the source voltage generation circuit 235, of which the circuit diagram is shown in FIG. 9. The source voltage generation circuit 235 is also characterized in that it is made up of an inverting amplifier of which the gain is changed with the inputs of the second signals SX0~SX4 from the counter decoder 150, thereby making it possible to change the output verify source voltage VVFYSource.

Figure 10:
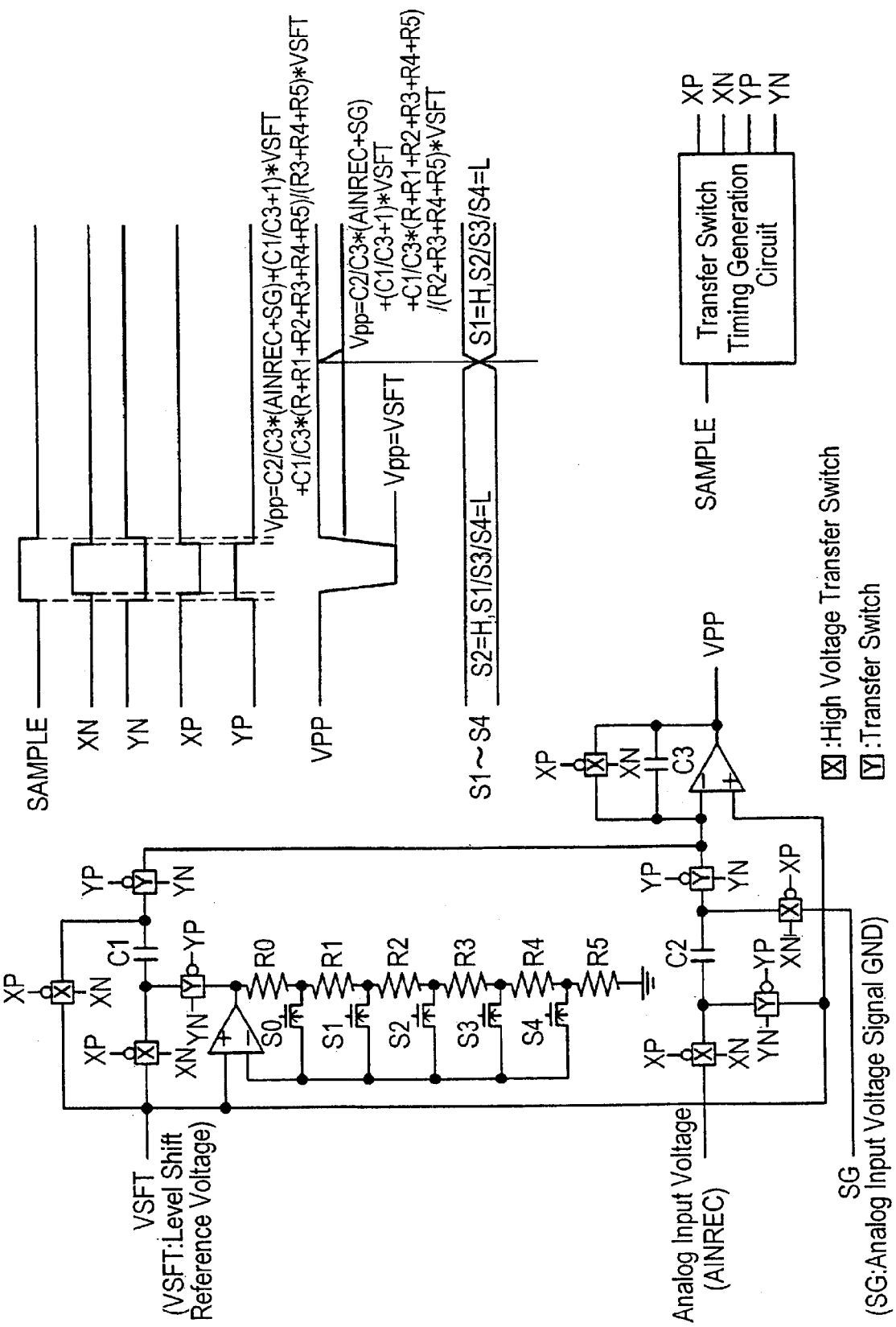
FIG. 10 shows diagrams including a circuit diagram of a write voltage generation 2, a timing chart of a signal SAMPLE, and a block diagram of a timing generation circuit in connection with the third, fifth, and seventh embodiments according to the invention.

Furthermore, the write circuit 300 is characterized in that the write voltage generation circuit 110 having been used in the write circuits 100 and 200 is replaced by the write voltage generation circuit 210, of which the circuit diagram is shown in FIG. 10. The write voltage generation circuit 210 is also characterized in that it is formed as a sample-hold level-shift circuit and is able to change the level shifted output write voltage Vpp after holding the sample.

The verify voltage generation circuit 120 and the up-down shift register circuit 170 are identical to those which have been adopted and already described in connection with the first and second embodiments of the invention.

Figure 21:
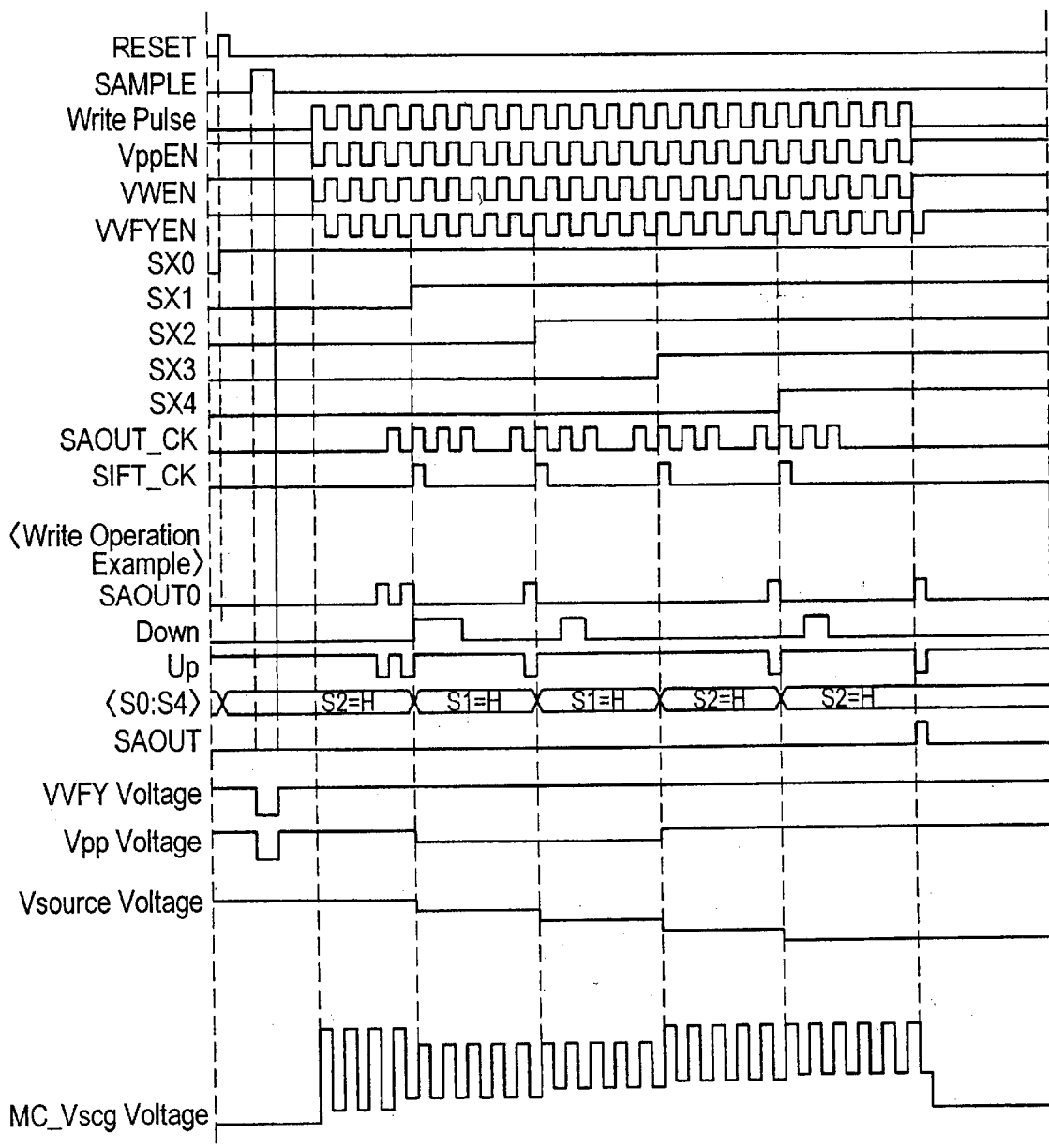
FIG. 21 is a timing chart for explaining the operation of the third embodiment according to the invention.

FIG. 21 shows a timing chart of the operation of the third embodiment according to the invention. A target memory cell treated by means of the erase operation is selected by the X-decoder 130X, the Y-decoder 130Y and the source decoder 130S. Then, the counter circuit 152 and the up-down shift register circuit 170 are first reset by a reset pulse RESET. With this, the output S2 of the up-down shift register circuit 170 as reset is at the level of H. The output SXO of the counter decoder 150 as reset is also at the level of H.

With the input of a signal SAMPLE, the sample-hold and level-shift operations of an input analog voltage are carried out by the write voltage generation circuit 210 and the verify voltage generation circuit 120, thereby the write voltage Vpp and the verify voltage VVFY being generated, respectively. At this time, the input analog voltage value AINREC has the following relation with the write voltage Vpp and the verify voltage VVFY, that is:

$$Vpp=C2/C3 \times (AINREC-SG)+(C1/C3+1) \times VSFT+C1/C3 \times (R0+R1+R2+R3+R4+R5)/(R3+R4+R5) \times VSFT$$

$$VVFY=C1/C2 \times (AINREC-SG)+VSFT$$

where

VSFT: reference voltage for write voltage Vpp

SG: reference voltage for input voltage AINREC

C1~C3: condenser capacitance

R0~R5: gain resistance

The write/verify operation begins when clock signals corresponding to the write pulse and enable signals VppEN, VWEN and VVFYEN are given to the counter circuit 152, the up-down shift register circuit 170, and PMOS's MP1, MP2 and MP3, respectively.

FIG. 22 shows graphs representing the relation between the Vcg-Ids characteristics of the memory cell and the output SAOUT at the time of the verify operation in the write circuit 300 according to the third embodiment. The Vcg-Ids characteristic is varied with the rise of the memory cell threshold value Vt as shown by curves (0)~(4), the memory cell threshold value Vt rising with repetition of the write/verify operation. In the memory cell verify operation of the third embodiment, the verify voltage VVFY (impressed on the control gate of the memory cell) generated by the verify voltage generation circuit 120 is kept constant while the source voltage VVFYSource generated by the source voltage generation circuit 235 is varied by the outputs SXO~SX4 of the counter decoder circuit 150 as follows.

When SX0=H, $$VVFYSource=-(R0)/(R1+R2+R3+R4+R5) \times (SG-Vref)+Vref$$

When SX1=H, $$VVFYSource=-(R0+R1)/(R2+R3+R4+R5) \times (SG-Vref)+Vref$$

When SX2=H, $$VVFYSource=-(R0+R1+R2)/(R3+R4+R5) \times (SG-Vref)+Vref$$

When SX3=H, $$VVFYSource=-(R0+R1+R2+R3)/(R4+R5) \times (SG-Vref)+Vref$$

When SX4=H, $$VVFYSource=-(R0+R1+R2+R3+R4)/R5 \times (SG-Vref)+Vref$$

The outputs SX0~SX4 (the second control signals) of the counter decoder 150 at the start of the write operation are respectively set such that only the SXO is at the level of H and others SX1~SX4 are at the level of L. After starting the write operation, the outputs SX0~SX4 are L-H inverted in the order of SX1, SX2, SX3 and SX4 according to the number of write pulses (write period of time). With the L-H inversion of SX1, SX2, SX3 and SX4 in the order thereof, the verify source voltage VVFYSource is decreased in the order of verify source0, verify source1, verify source2, verify source3 and verify source4.

Since the source-control gate voltage Vscg at the time of the verify operation is described as Vscg=VVFY (constant)—VVFYSource, if the outputs SX0~SX4 are L-H inverted in the order of SX1, SX2, SX3 and SX4, the Vscg voltage is increased in the order of Vscg0, Vscg1, Vscg2, Vscg3 and Vscg4. Thus, the memory cell threshold value Vt which is L-H inverted by the sense amplification inverter, rises in the order of Vscg0, Vscg1, Vscg2, Vscg3 and Vscg4.

At the start of the write operation, the write voltage Vpp as initially set is written to the selected memory sell, that is:

$$Vpp=C2/C3 \times (AINREC-SG)+(C1/C3+1) \times VSFT+C1/C3 \times (R0+R1+R2+R3+R4+R5)/(R3+R4+R5) \times VSFT$$

is written to the selected memory sell, and the memory cell threshold value Vt rises as described above.

At the time of the verify operation, the source-control gate voltage Vscg is impressed on the memory cell control gate, the voltage Vscg being determined by the memory cell source voltage VVFYSource generated from the source voltage generation circuit 235 when the output SX0 of the counter decoder 155 is set to be H, and the output ASOUT0 is L-H inverted when the current Ids becomes equal to or larger than the reference comparison current Iref. The output of the up-down shift resister circuit 170 is varied based on the result of the SAOUT0, thereby varying the write voltage Vpp.

If ASOUT0 is L-H inverted before SX1 is L-H inverted, S2=H of the up-down shift register circuit 170 is shifted to S1=H, and the write voltage Vpp increases as follows.

$$Vpp=C2/C3 \times (AINREC-SG)+(C1/C3+1) \times VSFT+C1/C3 \times (R0+R1+R2+R3+R4+R5)/(R4+R5) \times VSFT$$

The timing chart of FIG. 21 describes the case where SX1 is L-H inverted before SAOUT0 is L-H inverted.

In the similar manner, if the outputs SX1~SX4 of the counter decoder circuit 155 are L-H inverted in the order of SX1, SX2, SX3 and SX4 according to the number of write pulses (write period of time), the output of the up-down shift register circuit 170 is varied based on the result of the output SAOUT0, thereby varying the write voltage Vpp.

Accordingly, if the number of write pulses (write period of time) L-H inverting the outputs SX1~SX4 of the decoder circuit 155 and the descent coefficient of the memory cell source voltage VVFYSource generated by the source voltage generation circuit 235, are typically adjusted so as to meet the characteristic of the write time (number of write pulses)—memory cell threshold value Vt of the selected memory cell, the write operation can be continued looking for the suitable write condition meeting the write characteristics of the selected memory cell. For instance, if the memory cell has a slow write speed, the write voltage Vpp therefor may be decreased.

When the drain current of the memory cell resulting from the voltage (final write voltage Vscg) impressed on the control gate of the memory cell has become equal to or less than the reference comparison current Iref, the signal of the level H is outputted from the SAOUT, thereby the write operation of the selected memory cell being terminated.

As described above, according to the third embodiment of the invention, the outputs SX0~SX4 from the decoder circuit 155 are L-H inverted in the order of SX0, SX1, SX2, SX3 and SX4 according to the number of the write pulses (write period of time). Furthermore, the output source voltage VVFYSource from the source voltage generation circuit 235, which is varied with the above inverted outputs SX0~SX4, is impressed on the source of the selected memory cell, thereby varying the write voltage Vpp. Therefore, according to this embodiment, the write voltage Vpp can be increased when executing the write operation with regard to the memory cell having a slow initial write speed, and contrary to this, the write voltage Vpp can be decreased when executing the write operation with respect to the memory cell having a fast initial write speed. This means that the write operation can be carried out looking for the most suitable write condition meeting the write characteristic of the selected memory cell.

Accordingly, even if the memory cell has an initial write speed which is made slow from the beginning or made slow due to the endurance deterioration, the analog voltage write operation can be terminated within a predetermined period of time without lowering the write accuracy of the analog voltage. Furthermore, even if the memory cell has a fast initial write speed, the write operation of the final analog voltage can be carried out at the saturated write threshold value Vt, thereby unevenness in the write accuracy of the analog voltage being well correcting.

Still further, in the source voltage generation circuit 235, the reference voltage Vref and the gain resistances R0~R5 of the inverting amplifier can be set such that the output source voltage VVFYSource of the source voltage generation circuit 235 is lower than the ground potential GNP.

If an memory cell as excessively erased is included in non-selected memory cells as normally erased which are lying along the same bit line as the memory cell selected for write, it is possible to make the source voltage VVFYSource of the memory cell as excessively erased be equal to or higher than the ground potential GNP, so that the Ids leakage in the excessively erased memory cell can be prevented at the time of the verify operation. Accordingly, it is possible to prevent deviation of the memory cell threshold value Vt with deviation of the reference comparison current Iref caused by the Ids leakage at the time of the verify operation.

Still further, when changing the voltage Vpp from the write voltage generation circuit 210 by inputting the outputs S0~S4 from the up-down shift register 170, the voltage of the electrode of an electric charge distribution condenser (C1) connected with the negative terminal of a condenser ratio amplifier as well as the voltage of another electrode of the condenser (C1) not connected with the same are changed without changing the voltage of the positive terminal of the condenser ratio amplifier. Therefore, it is possible to quickly change the write voltage Vpp in response to the change of the outputs S0~S3, comparing with the case of changing the positive terminal voltage of the condenser ratio amplifier. According to the third embodiment, the sense amplifier 240 is made up of a simple current mirror circuit and one inverter without using the multi-level sense amplifier 140, so that the layout area occupied thereby can be made narrower.

Accordingly, the third embodiment makes it possible to minimize increase in the entire layout area per chip by dividing circuit portions into small circuit units, the circuit portion being made up of an X-decoder 130X, a Y-decoder 130Y and a source decoder 130S, all of which are used for selecting a memory cell to be written, a PMOS MP3 conducting a write memory cell drain voltage VW to the Y-decoder 130Y at the time of the write operation, a source follower NMOS MN1 conducting the drain voltage to Y-decoder 130Y for preventing the read disturb of the memory cell at the time of the verify operation, and PMOS's MP4 and MP5, NMOS's MN2 and MN3 and a inverter INV0 which forms the sense amplifier 240 comparing the memory cell drain current with the reference comparison current Iref at the time of the verify operation. Accordingly, this is effective for realizing the high speed write operation by dividing the memory bits into smaller memory bits, thereby lessening the number of word/bit lines per memory array.

[Fourth Embodiment]

Figure 11:
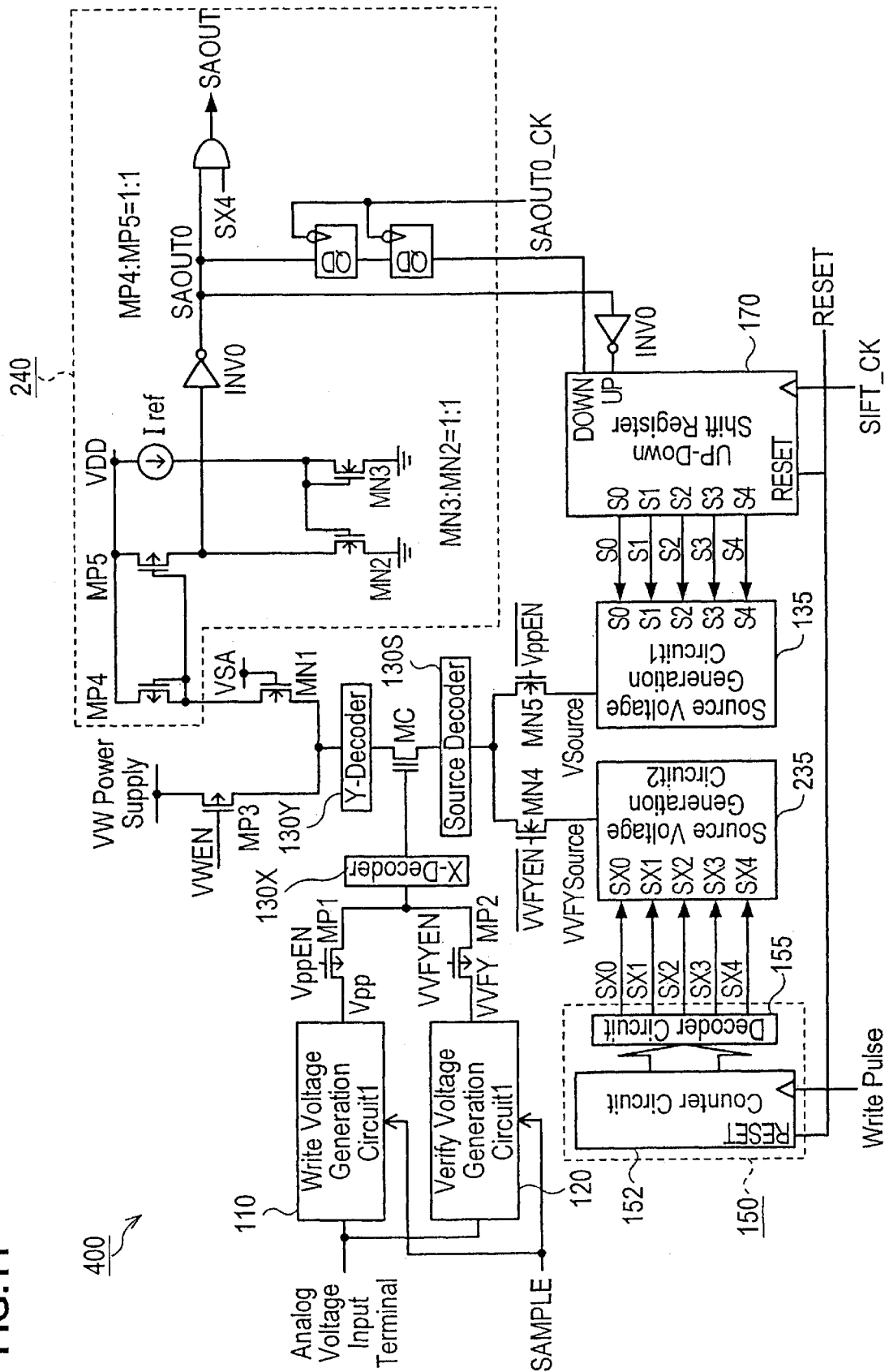
FIG. 11 is a circuit diagram of the fourth embodiment according to the invention.

FIG. 11 is a circuit diagram of a write circuit according to the fourth embodiment of the invention. This circuit 400 includes a write voltage generation circuit 110 which generates a write voltage Vpp based on the value of an analog voltage as inputted, the write voltage Vpp being impressed on the control gate of the memory cell at the time of the write operation, and a verify voltage generation circuit 120 generating a memory cell verify voltage VVFY, which is impressed on the control gate of the memory cell at the time of the verify operation.

Furthermore, the write circuit 400 includes an X-decoder 130X, a Y-decoder 130Y and a source decoder 130S, all of which are used for selecting a memory cell to be written, a PMOS MP1 conducting the write voltage Vpp to the X-decoder 130X at the time of the write operation, a PMOS MP2 conducting the verify voltage VVFY to the X-decoder at the time of the verify operation, a PMOS MP3 conducting a write memory cell drain voltage VW to the Y-decoder 130Y at the time of the write operation, an NMOS MN5 conducting a source voltage VSource to the source decoder 130S at the time of the write operation, an NMOS MN4 conducting the a verify source voltage VVFYSource to the source decoder 130S at the time of the verify operation, a source voltage generation circuit 235 generating a verify source voltage VVFYSource to be impressed on the source of memory cell at the time of the verify operation, a source voltage generation circuit 135 generating the source voltage VSource to be impressed on the memory cell source at the time of the write operation, a source voltage generation circuit 235 generating a verify source voltage VVFYSource to be impressed on the memory cell source at the time of the verify operation, and a source follower NMOS MN1 conducting the drain voltage to Y-decoder 130Y for preventing the read disturb of the memory cell at the time of the verify operation.

The write circuit 400 still further includes a sense amplifier 240 comparing the memory cell drain current with the reference comparison current Iref at the time of the verify operation. This sense amplifier 240 is made up of PMOS's MP4 and MP5, NMOS's MN2 and MN3 and a inverter INV0, a counter decoder circuit 150 outputting a signal when the number of write signal pulses has reached a predetermined value, and an up-down shift register circuit 170 shifting outputs S0~S4 to dual directions MSB/LSB based on the output SAOUT0 of the sense amplifier 240. The outputs S0~S4 from the up-down shift register circuit 170 are inputted to the source voltage generation circuit 235 as described before. The outputs SX0~SX4 of the counter decoder circuit 150 are also inputted to the source voltage generation circuit 235.

This write circuit 400 is formed as described above.

The write voltage generation circuit 110, the verify voltage generation circuit 120, the source voltage generation circuit 135 and the up-down shift register circuit 170 are constituted respectively in the same way as those which have been described so far in connection with the first and second embodiments of the invention. The verify source voltage generation circuit 235 has the same structure as that which has been described in the third embodiment of the invention.

Figure 23:
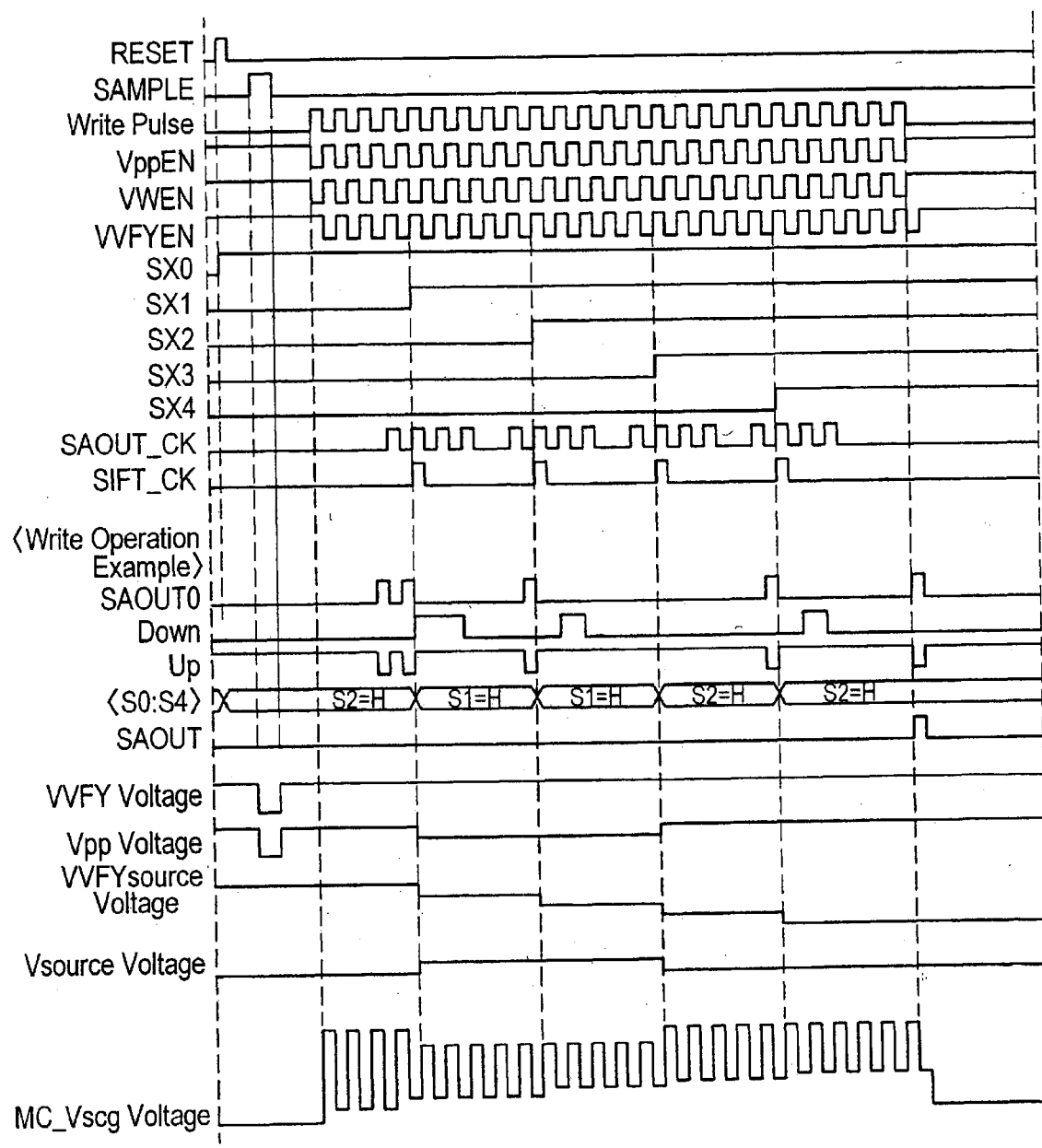
FIG. 23 is a timing chart for explaining the operation of the fourth embodiment of the invention.

FIG. 23 shows a timing chart of the operation of the fourth embodiment according to the invention. A target memory cell treated by means of the erase operation is selected by the X-decoder 130X, the Y-decoder 130Y and the source decoder 130S. Then, the counter circuit 152 and the up-down shift register circuit 170 are first reset by a reset pulse RESET. With this, the output S2 of the up-down shift register circuit 170 under the reset state is at the level of H. The output SX0 of the counter decoder 150 as reset is also at the level of H.

With the input of a signal SAMPLE, the sample-hold and level-shift operations of an input analog voltage are carried out by the write voltage generation circuit 110 and the verify voltage generation 120 as well, thereby the write voltage Vpp and the verify voltage VVFY being generated, respectively. At this time, the input analog voltage AINREC has the following relation with the write voltage Vpp and the verify voltage VVFY, that is:

$$Vpp = C2/C3 \times (AINREC - SG) + (C1/C3 + 1) \times VSFT$$

$$VFFY = C1/C2 \times (AINREC - SG) + VSFT$$

where

VSFT: reference voltage for write voltage Vpp

SG: reference voltage for input voltage AINREC

C1~C3: condenser capacitance

The write/verify operation begins when clock signals corresponding to the write pulse and enable signals VppEN, VWEN and VVFYEN are given to the counter circuit 152, the up-down shift register circuit 170, PMOS's MP1, MP2 and MP3, and NMOS's MN4 and MN5, respectively.

FIG. 22 shows graphs representing the relation between the Vcg-Ids characteristics of the memory cell and the output SAOUT at the time of the verify operation in the write circuit 400 according to the fourth embodiment. The Vcg-Ids characteristic is varied as shown by curves (0)~(4) with the rise of the memory cell threshold value Vt, which is caused by repeating the write/verify operation. In the memory cell verify operation of the fourth embodiment, the verify voltage VVFY (impressed on the control gate of the memory cell) generated by the verify voltage generation circuit 120 is kept constant while the source voltage VVFY-Source generated by the source voltage generation circuit 235 is varied by the outputs SX0~SX4 of the counter decoder circuit 150 as follows.

When SX0=H, $$VVFYSource = -(R0)/(R1+R2+R3+R4+R5) \times (SG-Vref) + Vref$$

When SX1=H, $$VVFYSource = -(R0+R1)/(R2+R3+R4+R5) \times (SG-Vref) + Vref$$

When SX2=H, $$VVFYSource = -(R0+R1+R2)/(R3+R4+R5) \times (SG-Vref) + Vref$$

When SX3=H, $$VVFYSource = -(R0+R1+R2+R3)/(R4+R5) \times (SG-Vref) + Vref$$

When SX4=H, $$VVFYSource = -(R0+R1+R2+R3+R4)/R5 \times (SG-Vref) + Vref$$

The outputs SX0~SX4 of the counter decoder 155 at the time of starting the write operation are set such that only the output SX0 is at the level of H while others SX1~SX4 are at the level of L. After starting the write operation, the outputs SX0~SX4 are L-H inverted in the order of SX1, SX2, SX3 and SX4 according to the number of write pulses (write period of time).

With the L-H inversion in the order of SX1, SX2, SX3 and SX4, the verify source voltage VVFYSource is decreased in the order of verify source0, verify source1, verify source2, verify source3 and verify source4.

Since the source-control gate voltage Vscg at the time of the verify operation is described as Vscg=VVFY (constant) VVFYSource, if the outputs SX0~SX4 are L-H inverted in the order of SX1, SX2, SX3 and SX4, the Vscg voltage is increased in the order of Vscg0, Vscg1, Vscg2, Vscg3 and Vscg4.

Thus, the memory cell threshold value Vt which is L-H inverted by the sense amplifying inverter, rises in the order of Vscg0, Vscg1, Vscg2, Vscg3 and Vscg4.

At the time of starting the write operation, the write voltage Vpp (constant) is expressed as:

$$Vpp = C2/C3 \times (AINREC-SG) + (C1/C3+1) \times VSFT$$

and the source voltage VSource as set initially is expressed as:

$$VSource = -(R0+R1+R2)/(R3+R4+R5) \times (SG-Vref) + Vref$$

where

Vref: reference voltage of inverting amplifier

VSFT: reference voltage for write voltage Vpp

SG: reference voltage for input voltage AINREC

C1~C3: condenser capacitance

R0~R5: gain resistance

Thus, the voltage at the start of the write operation becomes;

$$Vpp(\text{constant}) - VSource = [C2/C3 \times (AINREC-SG)+(C1/C3+1) \times VSFT] - [-(R0+R1+R2)/(R3+R4+R5) \times (SG-Vref)+Vref]$$

and this voltage becomes the voltage between the source and the control gate of the selected memory cell and is written to the selected memory cell, thereby the memory cell threshold voltage value Vt rising up, accordingly.

At the time of the verify operation, the source-control gate voltage Vscg is impressed on the control gate of the memory cell. This voltage Vscg is determined by the memory cell source voltage VVFYSource generated from the source voltage generation circuit 235 when the output SX0 of the counter decoder 155 is set to be H. The output ASOUT0 is L-H inverted when the current Ids becomes equal to or larger than the reference comparison current Iref. The output of the up-down shift resister circuit 170 is varied based on the output result of the SAOUT0, thereby varying the source voltage VSource.

If the output ASOUT0 is L-H inverted before SX1 is L-H inverted, S2=H of the up-down shift register circuit 170 is shifted to S1=H, and the source voltage VSource goes up as expressed below.

$$VSource = -(R0+R1)/(R2+R3+R4+R5) \times (SG-Vref) + Vref$$

and the source-control gate voltage of the selected memory cell goes down at the time of the write operation.

Contrary to this, if SX1 is L-H inverted before ASOUT0 is L-H inverted, S2=H of the up-down shift register circuit 170 is shifted to S3=H, and the source voltage VSource falls as expressed below.

$$V\text{Source}=-(R0+R1+R2+R3)/(R4+R5)\times(SG-V\text{ref})+V\text{ref}$$

and the source-control gate voltage of the selected memory goes up at the time of the write operation. The timing chart of FIG. 23 describes the case where SX1 is L-H inverted before SAOUT0 is L-H inverted.

In the similar manner, if the outputs SX1~SX4 of the counter decoder circuit 155 is L-H inverted in the order of SX1, SX2, SX3 and SX4 according to the number of write pulses (write period of time), the output of the up-down shift register circuit 170 is varied based on the output result of the SAOUT0, thereby varying the source voltage VSource.

Accordingly, if the number of write pulses (write period of time) L-H inverting the outputs SX1~SX4 of the decoder circuit 155 and the descent coefficient of the memory cell source voltage VVFYSource generated by the source voltage generation circuit 235, are typically adjusted so as to meet the write time (number of write pulses) vs. memory cell threshold value Vt characteristic of the selected memory cell, the write operation can be continued seeking the suitable write condition meeting the write characteristics of the selected memory cell. For instance, if the memory cell has a slow write speed, it possible to increase the source-control gate voltage of the memory cell at the time of the write operation. Contrary to this, if the memory cell has a fast write speed, it is possible to decrease the source-control gate voltage of the memory cell. When the drain current of the memory cell caused by impressing the voltage (final write voltage Vscg) on the control gate of the memory cell has become equal to or less than the reference comparison current Iref, the signal of H is outputted from the SAOUT, thereby the write operation of the selected memory cell being terminated.

As described above, according to the fourth embodiment of the invention, the outputs SX0~SX4 from the decoder circuit 155 are L-H inverted in the order of SX0, SX1, SX2, SX3 and SX4 according to the number of the write pulses (write period of time). Furthermore, the output source voltage VVFYSource from the source voltage generation circuit 235, which is descendingly varied with the above inverted outputs SX0~SX4, is impressed on the source of the selected memory cell, thereby varying the write source voltage VSource. Therefore, according to this embodiment, the source-control gate voltage of the memory cell can be increased when executing the write operation with respect to the memory cell having a slow write speed and, contrary to this, the source-control gate voltage of the memory cell can be decrease when executing the write operation in respect of the memory cell having a fast write speed. This means that the write operation can be carried out looking for the most suitable write condition (the source-control gate voltage of the memory cell at the time of the write operation) meeting the write characteristic of the selected memory cell.

Accordingly, even if the memory cell has a write speed which is made slow from the beginning or made slow due to the endurance deterioration, the analog voltage write operation can be terminated within a predetermined period of time without lowering the write accuracy of the analog voltage. Furthermore, even if the memory cell has a fast write speed, the final analog voltage write can be carried out at the saturated write threshold value Vt, thereby unevenness in the write accuracy of the analog voltage being well correcting.

Still further, in the source voltage generation circuit 135, the reference voltage Vref and the gain resistances R0~R5 of the inverting amplifier can be set such that the output source voltage VSource of the source voltage generation circuit 135 is equal to or higher than the ground potential GNP, and also in the source voltage generation circuit 235, the reference voltage Vref and the gain resistances R0~R5 of the inverting amplifier can be set such that the output verify source voltage VVFYSource of the source voltage generation circuit 235 is equal to or higher than the ground potential GNP.

Accordingly, if an memory cell as excessively erased is included in non-selected memory cells as normally erased lying along the same bit line as the memory cell selected for write, it is possible to make the source voltage VSource of the excessively erased memory cell be equal to or higher than the ground potential GNP, so that the Ids leakage can be prevented at the time of verify operation with respect of the excessively erased memory cell. Accordingly, it is possible to prevent deviation of the reference comparison current Iref caused by the Ids leakage at the time of the verify operation with respect of the excessively erased memory cell.

On one hand, since it is possible to make the source voltage VSource of the excessively erased memory cell be equal to or higher than the ground potential GNP, the Ids leakage in the excessively erased memory cell can be prevented. Accordingly, it becomes unnecessary to take any countermeasure with respect to the excessively erased memory cell, for instance, the countermeasure of making the current capacity of the VW power source generating the write drain voltage larger than the write current Ids of the selected memory cell for write. If the VW voltage source is formed by an LIS internal booster circuit, the increase of the current consumption can be suppressed. As described above, the circuit 400 according to the fourth embodiment can provide a circuit structure especially effective for the memory which is apt to cause the excessively erased memory cell.

Still further, when changing the write voltage Vpp of the write voltage generation circuit 110 by inputting the outputs S0~S4 from the up-down shift register 170, the voltage of the electrode of an electric charge distribution condenser (C1) connected with the negative terminal of a condenser ratio amplifier as well as the voltage of another electrode of the condenser (C1) not connected with the same are changed without changing the voltage of the positive terminal of the condenser ratio amplifier. Accordingly, it is possible to speedily change the write voltage Vpp in response to the change of the outputs S0~S3, comparing with the case of changing the voltage of the positive terminal the condenser ratio amplifier. According to the fourth embodiment, the sense amplifier 240 is made up of a simple current mirror circuit and one inverter without using the multi-level sense amplifier 140, so that the layout area occupied thereby can be made narrower.

Accordingly, the fourth embodiment makes it possible to minimize increase in the entire layout area per chip by dividing circuit portions into small circuit units, the circuit portions being made up of an X-decoder 130X, a Y-decoder 130Y and a source decoder 130S, all of which are used for selecting a memory cell to be written, a PMOS MP3 conducting a write memory cell drain voltage VW to the Y-decoder 130Y at the time of the write operation, a source follower NMOS MN1 conducting the drain voltage to Y-decoder 130Y for preventing the read disturb of the memory cell at the time of the verify operation, and PMOS's MP4 and MP5, NMOS's MN2 and MN3 and a inverter INV0 which forms the sense amplifier 240 comparing the memory cell drain current with the reference comparison current Iref at the time of the verify operation. Accordingly, this is effective for realizing the high speed write operation by dividing the memory bits into smaller memory bits, thereby lessening the number of word/bit lines per memory array.

[Fifth Embodiment]

Figure 12:
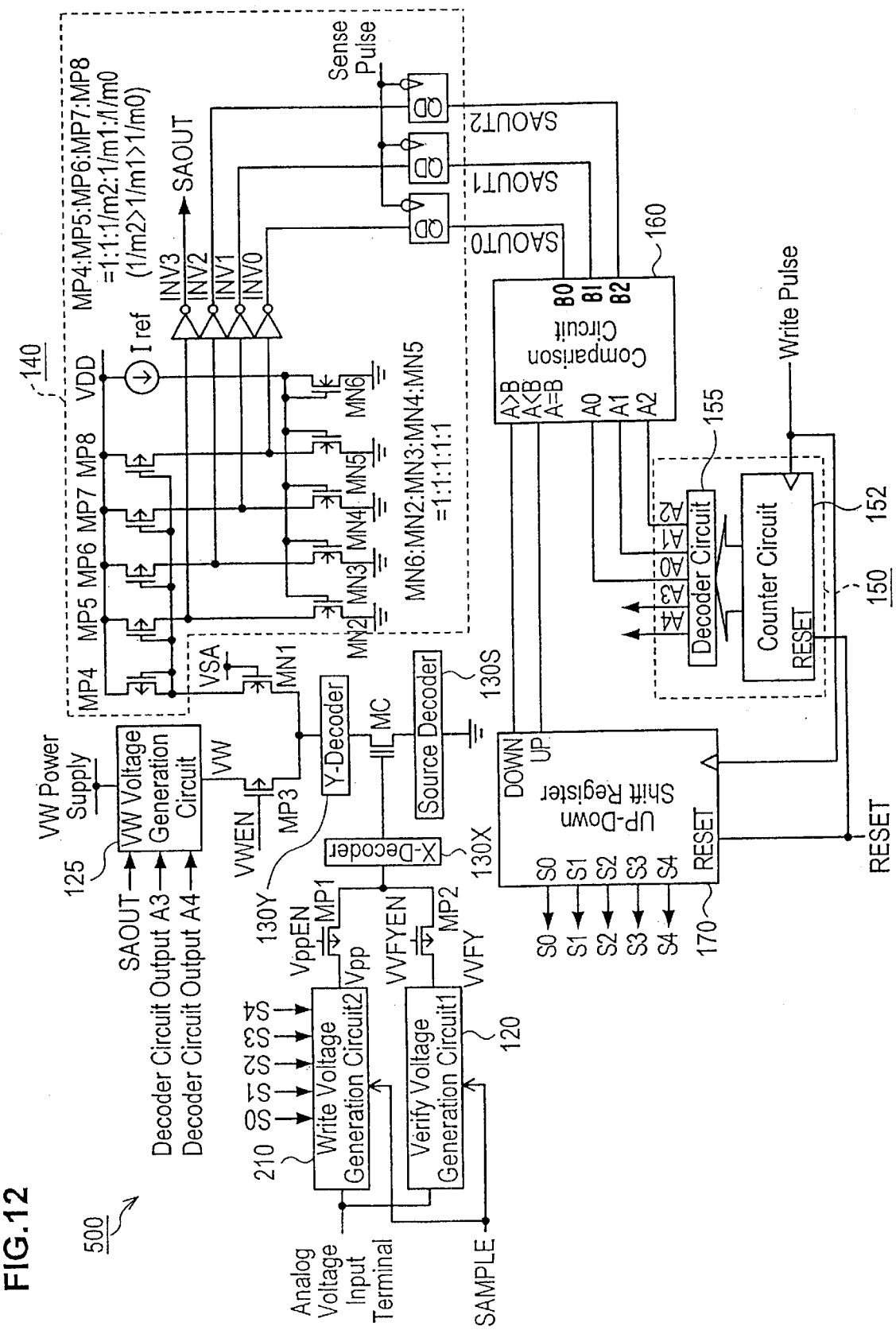
FIG. 12 is a circuit diagram of the fifth embodiment according to the invention.

FIG. 12 is a circuit diagram of a write circuit according to the fifth embodiment of the invention. This circuit 500 includes a write voltage generation circuit 210 which generates a write voltage Vpp based on the value of an analog voltage as inputted, the write voltage Vpp being impressed on the control gate of the memory cell at the time of the write operation, and a verify voltage generation circuit 120 generating a memory cell verify voltage VVFY, which is impressed on the control gate of the memory cell at the time of the verify operation.

Furthermore, the write circuit 500 includes an X-decoder 130X, a Y-decoder 130Y and a source decoder 130S, all of which are used for selecting a memory cell to be written, a PMOS MP2 conducting the verify voltage VVFY to the X-decoder 130X at the time of the write operation, a PMOS MP3 conducting the write memory cell drain voltage VW to the Y-decoder 130Y at the time of the write operation, a VW voltage generation circuit 125 generating the write memory cell drain voltage at the time of the write operation, and a source follower NMOS MN1 conducting the drain voltage to Y-decoder 130Y for preventing the read disturb of the memory cell at the time of the verify operation.

The write circuit 500 still further includes a multi-level sense amplifier 140 comparing the memory cell drain current with the reference comparison current Iref at the time of the verify operation, the sense amplifier 140 consisting of PMOS's MP4~MP8, NMOS's MN2~MN5 and inverters INV0~INV3, a counter decoder circuit 150 outputting a predetermined number of write signal pulses, a comparison circuit 160 comparing the outputs SAOUT0~SAOUT2 of the multi-level sense amplifier 140 with the outputs A0, A1 and A2 of the counter decoder 150, and an up-down shift register circuit 170 shifting outputs S0~S4 to dual directions MSB/LSB based on the comparison result of the comparison circuit 160. The outputs S0~S4 from the up-down shift register circuit 170 are inputted to the write voltage generation circuit 210 as described before. The outputs A3 and A4 of the counter decoder circuit 150 and also the output SAOUT are inputted to the VW voltage generation circuit 125.

This write circuit 500 is formed as described above.

Figure 13:
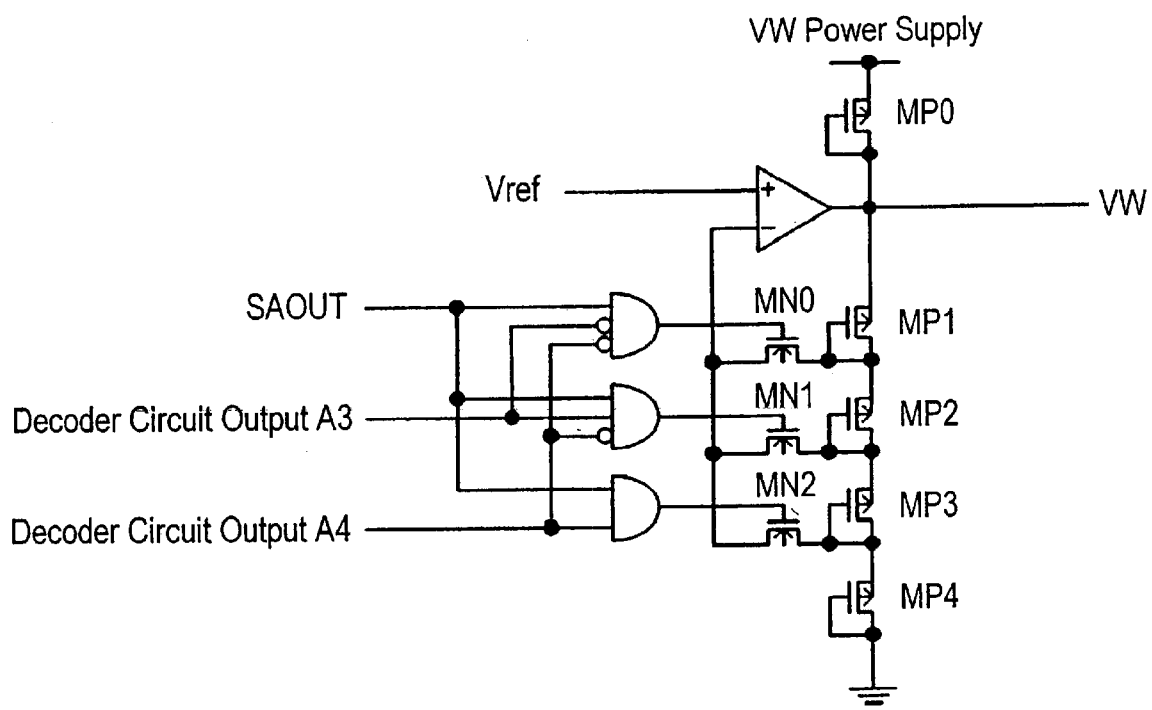
FIG. 13 is a circuit diagram of a VW voltage generation circuit relating to the fifth through eighth embodiments according to the invention.

FIG. 13 is a circuit diagram of the VW voltage generation circuit 125. The VW voltage generation circuit 125 is characterized in that it is constituted as a non-inverting amplifier, the gain of which is varied by inputting A3, A4 and SAOUT, thereby varying the VW voltage.

The write voltage generation circuit 210 is identical to that which is adopted in the third embodiment as described before, and the verify voltage generation circuit 120, the up-down shift register circuit 170, and comparison circuit 160 are identical those which are adopted in the first and second embodiments.

Figure 24:
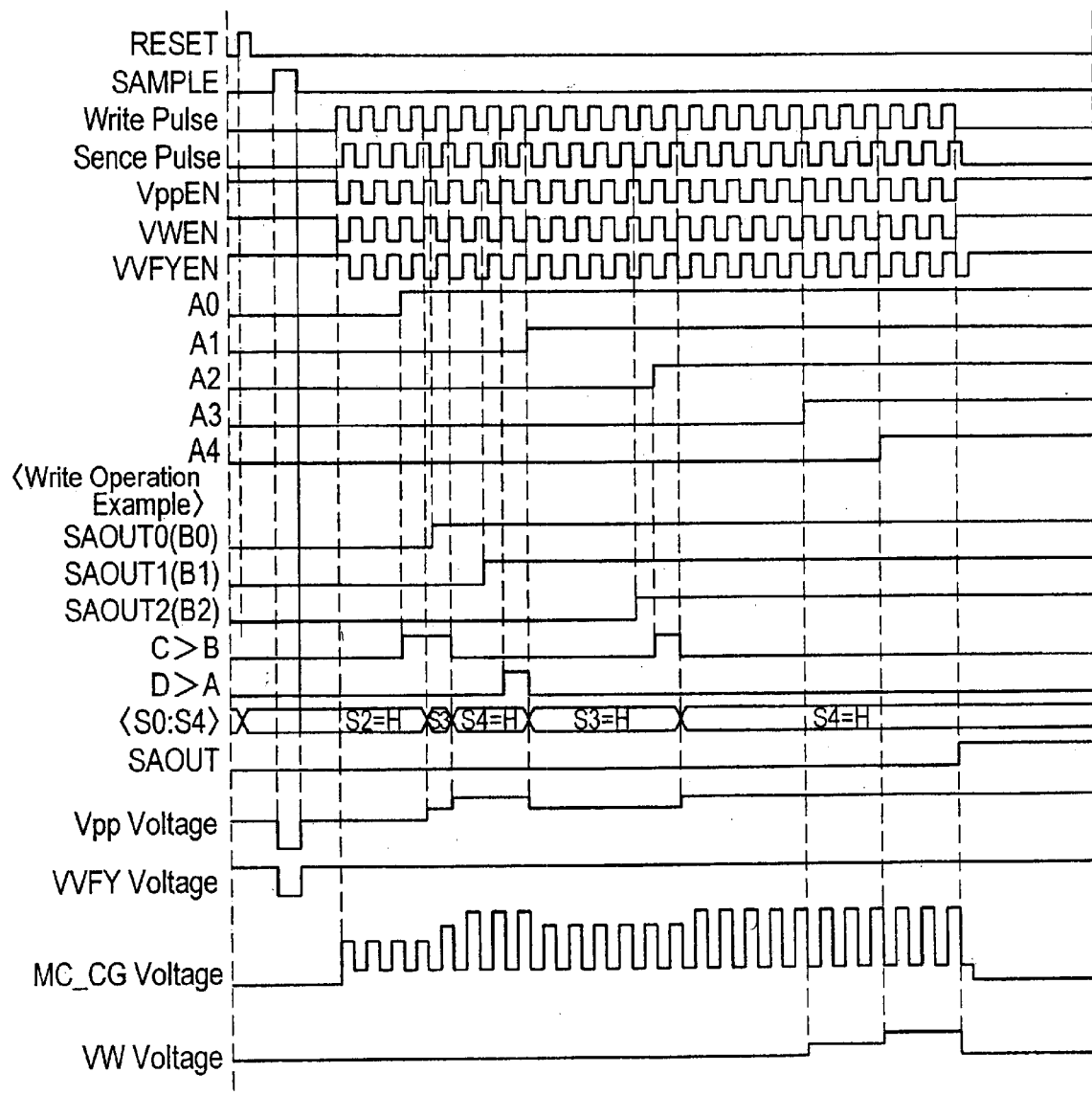
FIG. 24 is a timing chart for explaining the operation of the fifth through eighth embodiments of the invention.

FIG. 24 shows a timing chart of the operation of the fifth embodiment according to the invention. A target memory cell treated by means of the erase operation is selected by the X-decoder 130X, the Y-decoder 130Y and the source decoder 130S. Then, the counter circuit 152 and the up-down shift register circuit 170 are first reset by a reset pulse RESET. With this, the output S2 of the up-down shift register circuit 170 as reset is at the level of H.

With the input of a signal SAMPLE, the sample-hold and level-shift operations of an input analog voltage are carried out by the write voltage generation circuit 210 and the verify voltage generation 120, thereby the write voltage Vpp and the verify voltage VVFY being generated, respectively. At this time, the input analog voltage value AINREC has the following relation with the write voltage Vpp and the verify voltage VVFY, that is:

$$Vpp=C2/C3\times(AINREC-SG)+(C1/C3+1)\times VSFT+VSFT+C1/C3\times(R0+R1+R2+R3+R4+R5)/(R3+R4+R5)\times VSFT$$

$$VFFY=C1/C2\times(AINREC-SG)+VSFT$$

where

VSFT: reference voltage for write voltage Vpp

SG: reference voltage for input voltage AINREC

C1~C3: condenser capacitance

R0~R5: gain resistance

The write/verify operation begins when clock signals corresponding to the write pulse and enable signals VppEN, VWEN and VVFYEN are given to the counter circuit 152, the up-down shift register circuit 170, PMOS's MP1, MP2 and MP3, respectively.

FIG. 19 shows graphs representing the relation between the Vcg-Ids characteristics of the memory cell and the output SAOUT at the time of the write operation in the write circuit 500 according to the fifth embodiment. The Vcg-Ids characteristic is varied as shown by curves (0)~(4) of FIG. 19 with the rise of the memory cell threshold value Vt, which is caused by repeating the write/verify operation. At the time of the verify operation in the circuit 500 according to the fifth embodiment, the drain current of the memory cell is varied by the current mirror circuit made up of PMOS's MP4~MP8 and is compared with the reference comparison current Iref.

Since the driving power ratio among PMOS's MP4, MP5, MP6, MP7 and MP8 is set as MP4:MP5:MP6:MP7:MP8= 1:1/m2:1/m1:1/m0(1>1/m2>1/m1>1/m0), if the Vcg-Ids characteristic is varied with rise of the memory cell threshold value Vt as shown by the curves (0)~(4), the sense amplifying inverters INV0~INV3 are L-H inverted in the order of INV0, INV1, INV2 and INV3, and the outputs SAOUT0~SAOUT2 of the multi-level sense amplifier 14 are also L-H inverted in the order of SAOUT0, SAOUT1, and SAOUT2. The rising speed of the memory cell threshold value Vt is determined based on the memory cell characteristic and the write voltage VP at the time of the write operation.

At the start of the write operation, all the outputs A0~A2 of the decoder circuit 155 are set to be at the level L. After having started the write operation, these outputs A0~A2 are L-H inverted in the order of A0, A1 and A2 according to the number of write pulses (write period of time).

At the start of the write operation, the selected memory cell is written with the write voltage Vpp and the voltage VW as set initially, which are respectively expressed as follows.

$$Vpp=C2/C3\times(AINREC-SG+(C1/C3+1)\times VSFT+C1/C3\times(R0+R1+R2+R3+R4+R5)/(R3+R4+R5)\times VSFT$$

$$VW=(1+MP1\ R/(MP2\ R+MP3\ R+MP4\ R))\times Vref$$

where

Vref: reference voltage of inverting amplifier

VSFT: reference voltage for write voltage Vpp

SG: reference voltage for input voltage AINREC

C1~C3: condenser capacitance

R0~R5: gain resistance

MP×R: operating equivalent resistance (i.e. Vds/Ids)

With this write operation, the memory cell threshold value Vt is getting rise up. The outputs SAOUT0~SAOUT2 of the multi-level sense amplifier 140 are compared with the outputs A0~A2 of the decoder circuit 155 by the comparison circuit 160. The output of the up-down shift register circuit 170 is varied based on this comparison result, thereby varying the write voltage Vpp.

If the output SAOUT0 is L-H inverted before the output A0 is L-H inverted, the output A<B of the comparison circuit 160 is L-H inverted, by which the output S2=H of the up-down shift register circuit 170 is shifted to S1=H, and the write voltage Vpp falls to:

$$Vpp=C2/C3\times(AINREC-SG+(C1/C3+1)\times VSFT+C1/C3\times(R0+R1+R2+R3+R4+R5)/(R2+R3+R4+R5)\times VSFT$$

where

VSFT: reference voltage for write voltage Vpp

SG: reference voltage for input voltage AINREC

C1~C3: condenser capacitance

R0~RS: gain resistance

Contrary to this, if the output A0 is L-H inverted before the output SAOUT0 is L-H inverted, the output A>B of the comparison circuit 160 is L-H inverted, by which the output S2=H of the up-down shift register circuit 170 is shifted to S3=H, and the write voltage Vpp is increased to:

$$Vpp=C2/C3\times(AINREC-SG+(C1/C3+1)\times VSFT+C1/C3\times(R0+R1+R2+R3+R4+R5)/(R4+R5)\times VSFT$$

The timing chart shown in FIG. 24 indicates the latter case, that is, the case where the output A0 is L-H inverted before the output SAOUT0 is L-H inverted.

Similarly, if the outputs of A1 and A2 of the decoder circuit 155 are L-H inverted in the order thereof according to the number of write pulses (write period of time), the outputs SAOUT1 and SAOUT2 of the multi-level sense amplifier circuit 140 are compared with the outputs A1 and A2 of the decoder circuit 150 by means of the comparison circuit 160. With the result of this comparison, the output of the up-down shift register circuit 170 is varied, thereby varying the write voltage Vpp.

Accordingly, if the number of write pulses (write period of time) L-H inverting the outputs A0~A2 of the decoder circuit 155 and the driving power ratio between PMOS's MP4, MP5, MP6, MP7 and MP8 constituting the current mirror circuit of the multi-level sense amplifier circuit 140, that this, MP4:MP5: MP6:MP7:MP8=1:1/m2:1/m1:1/m0 (1>1/m2>1/m1>1/m0), are typically adjusted so as to meet the write time (number of write pulses)vs. memory cell threshold value Vt characteristic, the write operation can be continued looking for the suitable write condition (the suitable voltage impressed between the source and control gate of the selected memory cell in the write operation) meeting the write characteristics of the selected memory cell. In other words, if the memory cell has a slow write speed, the write voltage Vpp may be increased. Contrarily to this, if the memory cell has a fast write speed, the write voltage Vpp may be decreased.

Then, if the output A3 of the decoder 155 is L-H inverted, the VW voltage is increased to:

$$VW=(1+(MP1\,R+MP2\,R)/(MP3\,R+MP4\,R))\times Vref$$

where

Vref: reference voltage of inverting amplifier

MP×R: operating equivalent resistance (i.e. Vds/Ids)

Furthermore, if the output A4 of the decoder 155 is L-H inverted, the VW voltage is further increased to:

$$VW=(1+(MP1\,R+MP2\,R+MP3\,R)/MP4\,R)\times Vref$$

When the memory cell drain current becomes equal to or larger than the reference comparison current Iref, the output SAOUT comes to be at the level of H and the write operation of the selected memory cell is terminated.

As described above, according to the fifth embodiment of the invention, the outputs A0~A2 of the decoder circuit 155 are L-H inverted in the order of A0, A1 and A2 according to the number of the write pulses (write period of time). Furthermore, the outputs SAOUT0~SAOUT2 from the multi-level sense amplifier 140 are L-H inverted in the order of SAOUT0, SAOUT1 and SAOUT2 according to the rise of the memory cell threshold value Vt. Then, these two kinds of L-H inverted outputs are compared with each other by the comparison circuit 160, in response to the comparison result of which the write voltage Vpp is varied. Therefore, according to this embodiment, the write voltage of the memory cell can be increased when executing the write operation with respect to the memory cell having a slow write speed and, contrary to this, the write voltage Vpp of the memory cell can be decreased when executing the write operation in respect of the memory cell having a fast write speed. This means that the write operation can be carried out looking for the most suitable write condition meeting the write characteristic of the selected memory cell.

Accordingly, even if the memory cell has a write speed which is made slow from the beginning or made slow due to the endurance deterioration, the analog voltage write operation can be terminated within a predetermined period of time without lowering the write accuracy of the analog voltage. Furthermore, even if the memory cell has a fast initial write speed, the final analog voltage write can be carried out at the saturated write threshold value Vt, thereby unevenness in the write accuracy of the analog voltage being well corrected.

Furthermore, the write circuit 500 according to the fifth embodiment is constructed such that the voltage VW is made to increase in response to the outputs A3 and A4 of the decoder 155 and to the result of the output SAOUT at the time of the write operation, the outputs A3 and A4 being L-H inverted in the order thereof according to the number of the write pulses (write period of time). Therefore, even if the memory cell has such a initial write speed that is made extremely slow from the beginning or due to the conspicuous endurance deterioration and is no longer in the range of the write condition meeting the write characteristic of the selected memory cell, it is possible to speed up such a slow write speed by increasing the voltage VW, so that the analog voltage write operation can be terminated within a predetermined period of time without lowering the write accuracy of analog voltage.

[Sixth Embodiment]

Figure 14:
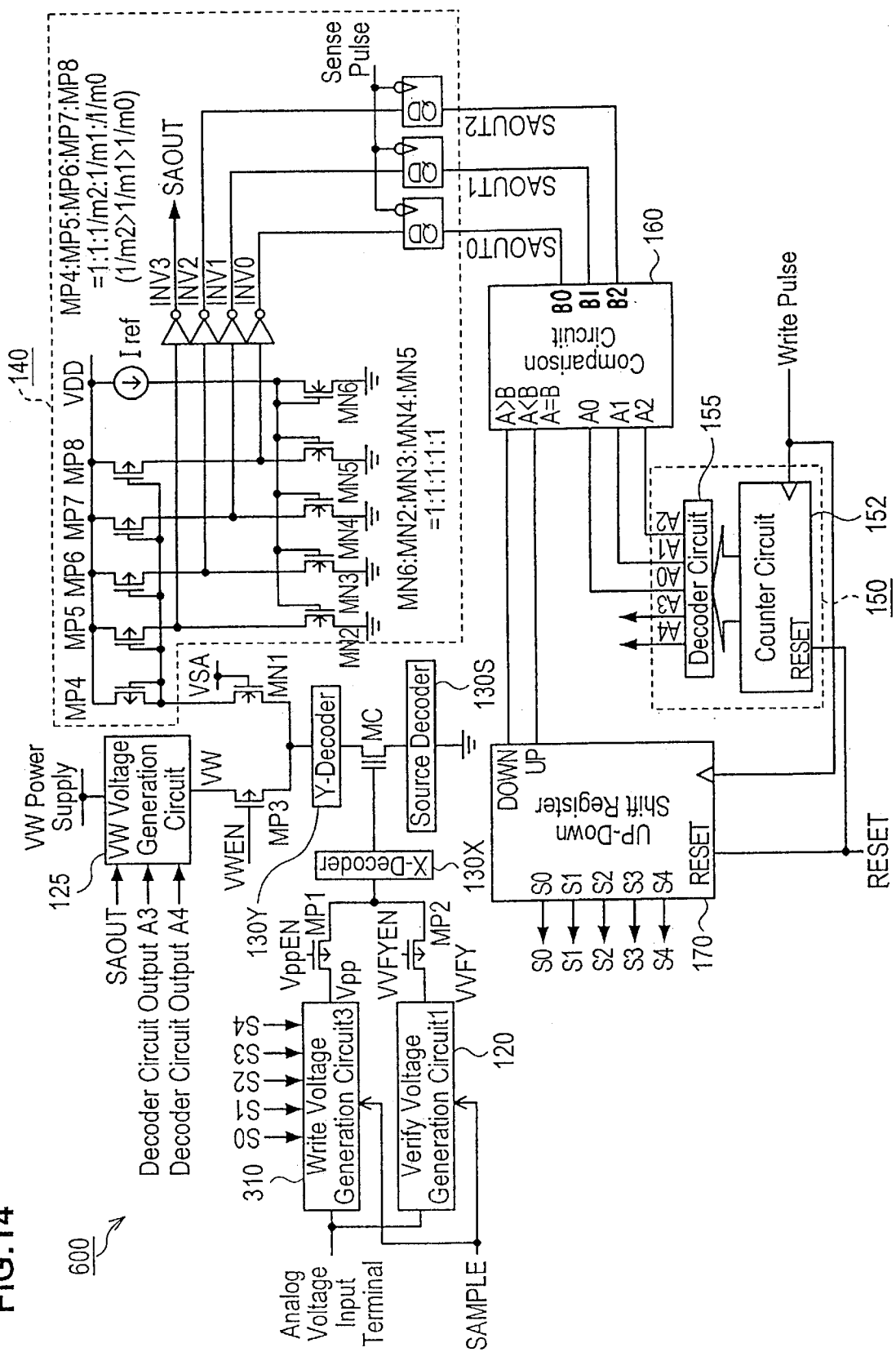
FIG. 14 is a circuit diagram of the sixth embodiment according to the invention.

FIG. 14 is a circuit diagram of a write circuit according to the sixth embodiment of the invention. This circuit 600 is substantially equal to the write circuit 500 according to the fifth embodiment except that a write voltage generation circuit 310 is different from the write voltage generation circuit 210 according to the fifth embodiment.

Figure 15:
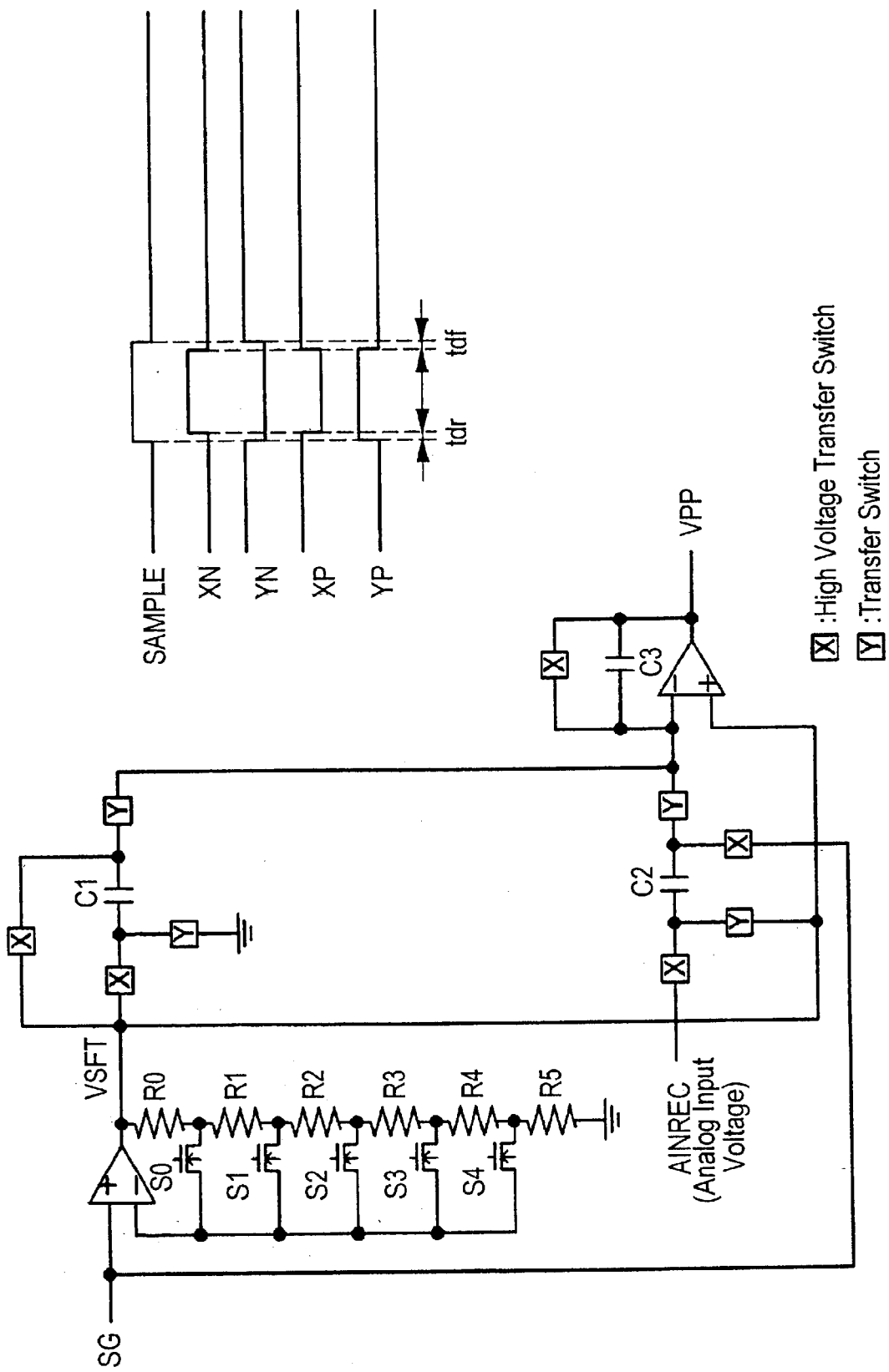
FIG. 15 shows diagrams including a circuit diagram of a write voltage generation 3 and a timing chart of a signal SAMPLE in connection with the sixth and eighth embodiments according to the invention.

FIG. 15 indicates a circuit diagram of the write voltage generation circuit 310. This write voltage generation circuit 310 has the same function as the write voltage generation circuit 210 and is characterized in that it is formed as a sample-hold level-shift circuit and is able to change the level shifted output write voltage Vpp after holding the sample responsive to the input of outputs SO~S4 from the up-down shift register circuit 170.

FIG. 24 is a timing chart indicating the operation of the write circuit 600 according to the sixth embodiment. This timing chart of the circuit 600 is similar to that of the write circuit 500, that is, the basic operation of both circuits becomes similar to each other. One of different points is that the relation between the input analog voltage value AINREC and the write voltage Vpp generated by the write voltage generation circuit 310 is expressed as follows.

$$Vpp=C2/C3 \times (AINREC-SG)+(C1/C3+1) \times (R0+R1+R2+R3+R4+R5)/(R3+R4+R5) \times SG$$

where

SG: reference voltage for input voltage AINREC

C1~C3: condenser capacitance

R0~R5: gain resistance

Another different point is that when the output SAOUT0 is L-H inverted before the output A0 of the decoder 155 is L-H inverted, and the output A<B of the comparison circuit 160 is L-H inverted, thereby S2=H of the up-down shift register 170 being shifted to S1=H, the write voltage Vpp is expressed as follows.

$$Vpp=C2/C3 \times (AINREC-SG)+(C1/C3+1) \times (R0+R1+R2+R3+R4+R5)/(R3+R4+R5) \times SG$$

Still another different point is that when the output A0 is L-H inverted before the output SAOUT0 is L-H inverted, and the output A>B of the comparison circuit 160 is L-H inverted, thereby S2=H of the up-down shift register 170 being shifted to S3=1, the write voltage Vpp is expressed as follows.

$$Vpp=C2/C3 \times (AINREC-SG)+(C1/C3+1) \times (R0+R1+R2+R3+R4+R5)/(R3+R4+R5) \times SG$$

In the circuit 600, similar to the circuit 500, the outputs A0~A2 of the decoder circuit 155 are L-H inverted in the order of A0, A1 and A2 according to the number of the write pulses (write period of time). Furthermore, the outputs SAOUT0~SAOUT2 from the multi-level sense amplifier 140 are L-H inverted in the order of SAOUT0, SAOUT1 and SAOUT2 according to the rise of the memory cell threshold value Vt. Then, these two kinds of L-H inverted outputs are compared with each other by the comparison circuit 160, in response to the comparison result of which the write voltage Vpp is varied. Therefore, according to the sixth embodiment, the write voltage Vpp can be increased when executing the write operation with regard to the memory cell having a slow write speed and, contrary to this, the write voltage Vpp can be decreased when executing the write operation with regard to the memory cell having a fast write speed. This means that the write operation can be carried out looking for the most suitable write condition meeting the write characteristic of the selected memory cell for write.

Accordingly, even if the memory cell has an initial write speed which is made slow from the beginning or due to the endurance deterioration, the analog voltage write operation can be terminated within a predetermined period of time without lowering the write accuracy of the analog voltage. Furthermore, even if the memory cell has a fast initial write speed, the final analog voltage write can be carried out at the saturated write threshold value Vt, thereby unevenness in the write accuracy of the analog voltage being well corrected.

Furthermore, the voltage VW of the VW voltage generation circuit 125 is made to increase at the time of the write operation in response to the outputs A3 and A4 of the decoder 155 and the result of the output SAOUT, the outputs A3 and A4 being L-H inverted in the order thereof according to the number of write pulses (write period of time). Thus, even if the memory cell has an initial write speed which is made extremely slow from the beginning or made extremely slow due to the endurance deterioration and is no longer within the range of the write condition meeting the write characteristic of the selected memory, it is possible to terminate the analog voltage write operation within a predetermined period of time without lowering the voltage VW at the time of the write operation.

In the sixth embodiment, the voltage of the positive terminal of the condenser ratio amplifier is made to increase by increasing the voltage VW when changing the output write voltage Vpp of the write voltage generation circuit 310 responsive to the input of the outputs S0~S4 from the up-down shift register 170. With this, the write voltage Vpp can be largely changed with the small change of the positive terminal voltage, comparing with the case of increasing the voltage of the electrode of an electric charge distribution condenser (C1) connected with the negative terminal of a condenser ratio amplifier as well as the voltage of another electrode of the condenser (C1) not connected with the same without changing the voltage of the positive terminal of the condenser ratio amplifier.

Therefore, according to the sixth embodiment, when executing the write operation with respect to the memory cell having a write speed which is made extremely slow from the beginning or is made extremely slow due to the endurance deterioration, the write voltage Vpp can be made to largely change with ease by raising the voltage VW a little, so that the write circuit 600 is especially effective when compensating the write speed of the memory cell which is made extremely slow from the beginning or due to the endurance deterioration (variation in the memory cell characteristic), or well correcting unevenness in the write speed due to the initial memory cell characteristic.

[Seventh Embodiment]

Figure 16:
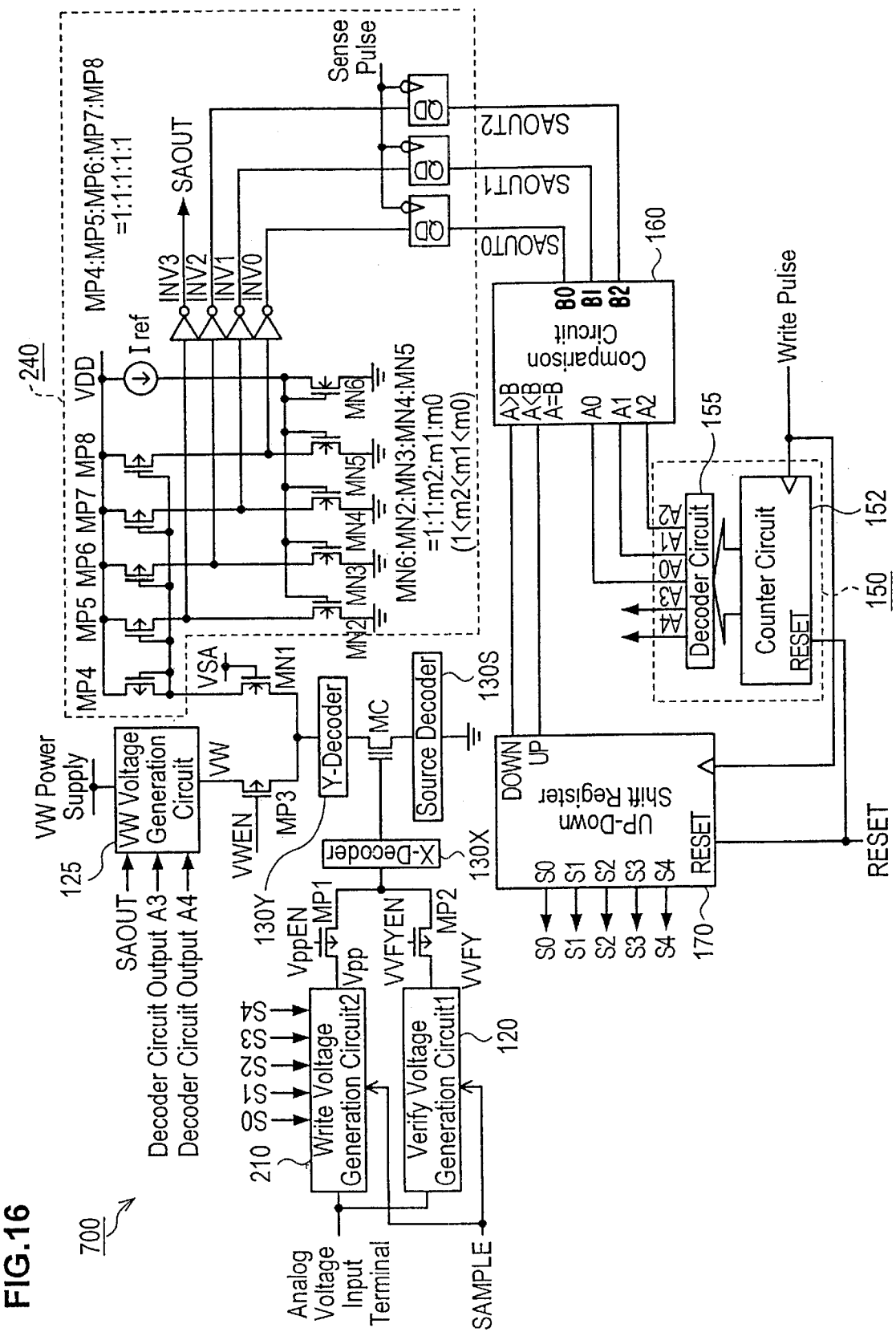
FIG. 16 is a circuit diagram of the seventh embodiment according to the invention.

FIG. 16 is a circuit diagram of a write circuit according to the seventh embodiment of the invention. This circuit 700 substantially equal to the write circuit 500 according to the fifth embodiment except that the driving power ratio of PMOS's MP4~MP8 and NMOS's MN2~MN6 of which the multi-level sense amplifier 140 is made up, is different from the driving power ratio of PMOS's MP4~MP8 and NMOS's MN2~MN6 of the multi-level sense amplifier 140. That is, in this embodiment, the driving power ratio of the above PMOS's and NMOS's is set as MP4:MP5:MP6:MP7:Mp8= 11:1:1:1, and MN6:MN2: MN3:MN4:MN5=1:1:m2:m1:m0 (1<m2<m1<m0).

FIG. 24 is a timing chart explaining the operation of the write circuit 700 according to the seventh embodiment. The basic operation of this write circuit 700 is basically similar to the operation of the write circuit 500 according to the fifth embodiment. The different point is that the relation between the Vcg-Ids characteristic of the memory cell and the output SAOUT0~ASOUT2 at the time of the write operation in the first embodiment as shown in FIG. 19, is changed to the relation between the Vcg-Ids characteristic of the memory cell and the output SAOUT0~ASOUT2 at the time of the write operation as shown in FIG. 20.

In FIG. 20, it is similar that the Vcg-Ids characteristic of the memory cell is varied as indicated by curves (0)~(4) shown in FIG. 20 with the rise of the memory cell threshold value Vt due to the repetition of the write/verify operation. However, the seventh embodiment is different in the point that the comparison current to be compared with the memory cell drain current at the time of the verify operation is made to be the current obtained by changing the reference comparison current Iref by means of the current mirror circuit made up of NMOS's MN2~MN6.

As described above, since the driving power ratio is set as MP4:MP5:MP6:MP7:Mp8=1:1:1:1, and MN6:MN2:

MN3:MN4:MN5=1:1:m2:m1:m0 (1<m2<m1<m0), it is a similar point that the sense amplifying inverters INV0, INV3 and INV3 are L-H inverted in the order thereof and also the outputs SAOUT0, SAOUT1 and SAOUT3 of the multi-level sense amplifier 14 are L-H inverted in the order thereof in correspondence with the change of curves (1) through (4) due to the rise of the memory cell threshold value Vt, and also that the rising speed of the memory cell threshold value Vt is determined by the write characteristic of the memory cell and the write voltage Vpp at the time of the write operation.

According to the seventh embodiment, similar to the fifth embodiment, the outputs A0, A1 and A2 of the decoder 150 which are L-H inverted in the order thereof according to the number of write pulses (write period of time), and the outputs SAOUT0, SAOUT1 and SAOUT2 of the multi-level sense amplifier 140 which are also L-H inverted in the order thereof with the rise of the memory cell threshold value Vt. These two kinds of inverted outputs are compared with each other by the comparison circuit 160, and the write voltage Vpp is varied in response to the comparison result of the comparison circuit 160. Therefore, the write voltage Vpp can be increased when executing the write operation with respect to the memory cell having a slow write speed and, contrary to this, it can be decreased when executing the write operation with regard to the memory cell having a fast write speed. This means that the write operation can be carried out looking for the most suitable write condition meeting the write characteristic of the selected memory cell for write.

Accordingly, even if the memory cell has an initial write speed which is made slow from the beginning or made slow due to the endurance deterioration, the analog voltage write operation can be terminated within a predetermined period of time without lowering the write accuracy of the analog voltage. Furthermore, even if the memory cell has a fast write speed, the final analog voltage write can be carried out at the saturated write threshold value Vt, thereby unevenness in the write accuracy of the analog voltage being corrected well.

Furthermore, the write circuit 700 has such a structure that the voltage VW is made to increase in response to the outputs A3 and A4 of the decoder 155 and to the result of the output SAOUT at the time of the write operation, the outputs A3 and A4 being L-H inverted in the order thereof according to the number of write pulses (write period of time). Therefore, even if the memory cell has such an initial write speed which is made extremely slow from the beginning or due to the conspicuous endurance deterioration and is no longer in the range of the write condition meeting the write characteristic of the selected memory cell, it is possible to speed up such a slow write speed by increasing the voltage VW, so that the analog voltage write operation can be terminated within a predetermined period of time without lowering the write accuracy of analog voltage.

In the seventh embodiment, similar to the fifth embodiment, when changing the output write voltage Vpp of the write voltage generation circuit 210 by inputting the outputs S0~S4 from the up-down shift register 170, the voltage of the positive terminal of the condenser ratio amplifier is made not to change but to increase the voltage of the electrode of an electric charge distribution condenser (C1) connected with the negative terminal of a condenser ratio amplifier as well as the voltage of another electrode of the condenser (C1) not connected with the same. Therefore, the write voltage Vpp can be quickly varied in response to the change of the outputs S0~S4, comparing with the case of changing the positive terminal voltage of the condenser ratio amplifier.

Furthermore, since the multi-level sense amplifier 140 of the write circuit 700 according to the seventh embodiment changes the driving power ratio of NMOS's making up of the current mirror circuit, to the ratio MN6:MN2:MN3:MN4:MN5=1:1:m2:m1:m0 (1<m2<m1<m0), the verify operation carried out by the inverters INV0~INV2 on the way of the write process is carried out by using the reference comparison current Iref' larger than the reference comparison current Iref. With this, it becomes possible to get speed up the verify operation by the inverters INV0~INV2 on the way of the write process in comparison with the verify operation using the reference comparison current Iref. In other words, the multi-level sense amplifier in the seventh embodiment becomes a high speed multi-level sense amplifier 140.

Therefore, according to the seventh embodiment, it becomes possible to shorten the time corresponding to the response time of the multi-level sense amplifier within the time of the memory cell verify operation carried out in the verify duration of the repetitive write/verify operation. This is advantageous and effective when executing the write operation using the high frequency write pulse.

Since the verify operation carried out with the inverters INV0~INV2 on the way of the write operation is executed by using the reference comparison current Iref' larger than the reference comparison current Iref, it is needed for PMOS's (MP4~MP8) of which the current mirror circuit of the multi-level sense amplifier 140 is made up, to be evenly provided with a dimension allowing the above PMOS' to operate in the saturated area with the Ids of MN5 using the largest Iref'. In case of forming this circuit in the process of □p>□n according to the seventh embodiment, the circuit can be achieved without making each dimension of PMOS's (MP4~MP8) larger than that of MN5. Accordingly, the layout area can be made smaller comparing with the case of forming this circuit in the process of □p<□n.

[Eighth Embodiment]

Figure 17:
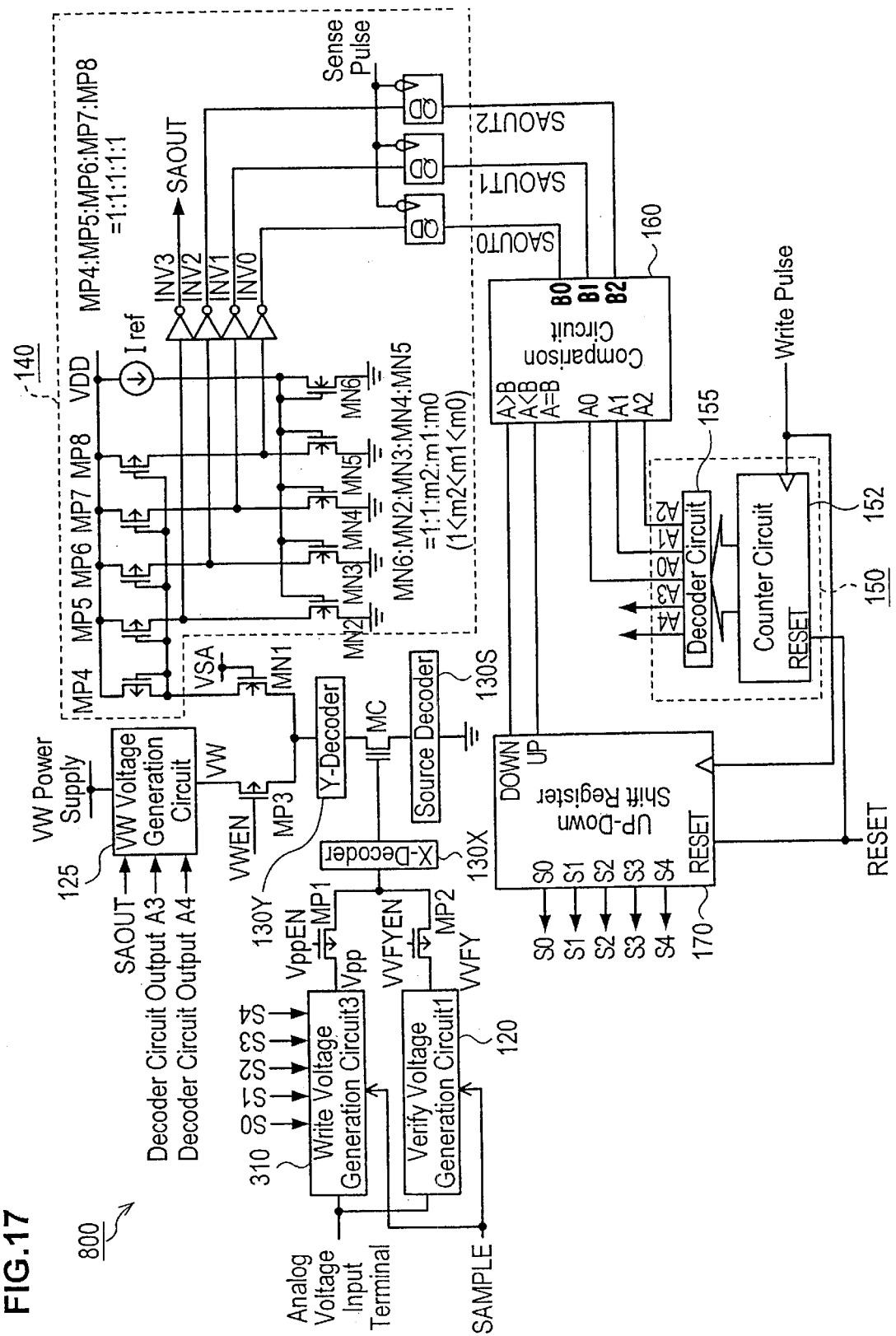
FIG. 17 is a circuit diagram of the eighth embodiment according to the invention.

FIG. 17 is a circuit diagram of a write circuit according to the eighth embodiment of the invention. This circuit 800 is similar to the seventh embodiment except that the write voltage generation circuit 310 is different from the write voltage generation circuit 210 of the seventh embodiment. The write voltage generation circuit 310 is the same as that (310) of the sixth embodiment.

FIG. 24 is a timing chart indicating the operation of the write circuit 800 according to the eighth embodiment. This timing chart of the circuit 800 is similar to that of the write circuit 700, that is, the basic operation of both circuits becomes similar to each other. One of difference therebetween is that relation between the input analog voltage value AINREC and the write voltage Vpp generated by the write voltage generation circuit 310 is expressed as follows.

$$Vpp=C2/C3\times(AINREC-SG)+(C1/C3+1)\times(R0+R1+R2+R3+R4+R5)/(R3+R4+R5)\times SG$$

where

SG: reference voltage for input voltage AINREC

C1~C3: condenser capacitance

R0~R5: gain resistance

Another difference is that the write voltage Vpp at the time when the output SAOUT0 is L-H inverted before the output A0 of the decoder 155 is L-H inverted, and the output A<B of the comparison circuit 160 is L-H inverted, thereby S2=H of the up-down shift register 170 being shifted to S1=H, is expressed as follows.

$$Vpp=C2/C3\times(AINREC-SG)+(C1/C3+1)\times(R0+R1+R2+R3+R4+R5)/(R3+R4+R5)\times SG$$

Still another difference is that the write voltage Vpp at the time when the output A0 is L-H inverted before the output SAOUT0 is L-H inverted, and the output A>B of the comparison circuit 160 is L-H inverted, thereby S2=H of the up-down shift register 170 being shifted to S3=H, is expressed as follows.

$$Vpp=C2/C3\times(AINREC-SG)+(C1/C3+1)\times(R0+R1+R2+R3+R4+R5)/(R3+R4+R5)\times SG$$

In the circuit 800 of the eighth embodiment, similar to the fifth embodiment, the outputs A0~A2 of the decoder circuit 155 are L-H inverted in the order of A0, A1 and A2 according to the number of the write pulses (write period of time). Furthermore, the outputs SAOUT0~SAOUT2 from the multi-level sense amplifier 140 are L-H inverted in the order of SAOUT0, SAOUT1 and SAOUT2 according to the rise of the memory cell threshold value Vt. Then, these two kinds of L-H inverted outputs are compared with each other by the comparison circuit 160, in response to the comparison result of which the write voltage Vpp is varied. Therefore, according to the eighth embodiment, the write voltage Vpp can be increased when executing the write operation with respect to the memory cell having a slow write speed and, contrary to this, the write voltage Vpp can be decreased when executing the write operation with regard to the memory cell having a fast write speed. This means that the write operation can be carried out looking for the most suitable write condition meeting the write characteristic of the selected memory cell for write.

Accordingly, even if the memory cell has an initial write speed which is made slow from the beginning or made slow due to the endurance deterioration, the analog voltage write operation can be terminated within a predetermined period of time without lowering the write accuracy of the analog voltage. Furthermore, even if the memory cell has a fast initial write speed, the final analog voltage write can be carried out at the saturated write threshold value Vt, thereby unevenness in the write accuracy of the analog voltage being well corrected.

Furthermore, the voltage VW of the VW voltage generation circuit 125 is made to increase at the time of the write operation in response to the outputs A3 and A4 of the decoder 155 and the result of the output SAOUT, the outputs A3 and A4 being L-H inverted in the order thereof according to the number of write pulses (write period of time). Thus, even if the memory cell has an initial write speed which is made extremely slow from the beginning or due to the endurance deterioration and is no longer within the range of the write condition meeting the write characteristic of the selected memory, it is possible to terminate the analog write operation within a predetermined period of time by increasing the voltage VW i.e. raising the write speed at the time of the write operation without lowering the write accuracy of the analog voltage.

In the eighth embodiment, similar to the sixth embodiment, the positive terminal voltage of the condenser ratio amplifier is made to increase when changing the output write voltage Vpp of the write voltage generation circuit 310 by inputting the outputs S0~S4 from the up-down shift register 170. With this, the write voltage Vpp can be largely changed with the small change of the positive terminal voltage, comparing with the case where the voltage of the electrode of an electric charge distribution condenser (C1) connected with the negative terminal of a condenser ratio amplifier as well as the voltage of another electrode of the condenser (C1) not connected with the same are made to increase without changing the positive terminal voltage of the condenser ratio amplifier.

Furthermore, similar to the seventh embodiment, since the multi-level sense amplifier 140 changes the driving power ratio of NMOS's of which the current mirror circuit is made up, to the ratio MN6:MN2:MN3:MN4:MN5= 1:1:m2:m1:m0 (1<m2<m1<m0), the verify operation of the memory cell threshold value Vt carried out by the inverters INV0~INV2 on the way of the write operation is executed by using the reference comparison current Iref' larger than the reference comparison current Iref. With this, the eighth embodiment comes to have the advantage that the multi-level sense amplifier can work as a high speed multi-level sense amplifier as well as the advantage that if the write circuit 800 is constructed in the process of □p>□n, it is no longer needed to make the dimension of PMOS MP4 larger, thereby obtaining the smaller layout area.

Accordingly, the eighth embodiment is especially effective when the conspicuous endurance deterioration exists in the process of □p>□n and it has to be compensated.

The electrical circuit for writing the analog voltage to the non-volatile memory according to the invention has been discussed so far by way of some preferred embodiments with reference to the accompanying drawings. Needless to say, however, the invention is not to be limited by those embodiments. It is apparent that any one who has an ordinary skill in the art is able to make various changes and modifications within the technical thoughts as recited in the scope of claim for patent as per attached hereto, and it is understood that those changes and modifications are covered by the technical scope of the invention, naturally.

As has been discussed in detail in the above, according to the invention, at the time of executing the write operation, the source-control gate voltage of the memory cell can be increased with respect to the memory cell having a slow write speed and, contrary to this, the source-control gate voltage of the memory cell can be decreased with regard to the memory cell having a fast write speed. This means that the write operation can be carried out looking for the most suitable write condition meeting the write characteristic of the selected memory cell for write. Accordingly, the invention provides the improvement in the accuracy of the write voltage as well as the shortening of the write time in the write operation of the analog voltage to the non-volatile memory.

What is claimed is:

1. An analog voltage supply circuit for a non-volatile memory comprising:

a write voltage generation circuit which generates a write voltage that is applied to a control gate of a memory cell in said non-volatile memory during a write operation, based on an input analog voltage;

a verify voltage generation circuit which generates a verify voltage that is applied to said control gate during a verify operation, based on said input analog voltage;

a source voltage generation circuit having an inverting amplifier which generates a source voltage that is applied to a source of said memory cell during the write operation, wherein said source voltage is changed by varying a gain of said inverting amplifier responsive to a control signal;

a multi-level sense amplifier which compares a current mirror ratio current of a memory cell drain current with a reference comparison current during the verify operation;

a counter decoder circuit which outputs a signal equivalent to a number of write pulses applied to said memory cell;

a comparison circuit which compares an output of said multi-level sense amplifier with the number of write pulses determined by said counter decoder circuit; and an up-down shift register circuit which shifts a level of said control signals based on a comparison result provided by said comparison circuit.

2. An analog voltage supply circuit for a non-volatile memory comprising:

a write voltage generation circuit which generates a write voltage that is applied to a control gate of a memory cell in said non-volatile memory during a write operation, based on an input analog voltage;

a verify voltage generation circuit which generates a verify voltage that is applied to said control gate during a verify operation, based on said input analog voltage;

a source voltage generation circuit having an inverting amplifier which generates a source voltage that is applied to a source of said memory cell during the write operation, wherein said source voltage is changed by varying a gain of said inverting amplifier responsive to a control signal;

a multi-level sense amplifier circuit which compares a memory cell drain current with a current mirror ratio current of a reference comparison current during the verify operation;

a counter decoder which outputs a signal equivalent to a number of write pulses applied to said memory cell;

a comparison circuit which compares an output of said multi-level sense amplifier with the number of write pulses determined by said counter decoder circuit; and an up-down shift register which shifts a level of said control signals based on a comparison result provided by said comparison circuit.

3. An analog voltage supply circuit for a non-volatile memory comprising:

a write voltage generation circuit, having an electric charge distribution condenser and a condenser ratio amplifier, which generates a write voltage that is applied to a control gate of a memory cell in said non-volatile memory during a write operation, based on an input analog voltage, and which changes the write voltage by increasing a voltage of an electrode of the electric charge distribution condenser connected with a negative terminal of the condenser ratio amplifier as well as a voltage of another electrode of the electric charge distribution condenser not connected with the negative terminal of the condenser ratio amplifier, responsive to first control signals;

a verify voltage generation circuit which generates a verify voltage that is applied to said control gate during a verify operation, based on said input analog voltage;

a source voltage generation circuit having an inverting amplifier which generates a verify source voltage that is applied to a source of said memory cell during the verify operation, wherein said verify source voltage is changed by varying a gain of said inverting amplifier responsive to second control signals;

a sense amplifier which compares a memory cell drain current with a reference comparison current during a verify operation;

a counter decoder circuit which outputs the second control signals which are equivalent to a number of write pulses applied to said memory cell; and an up-down shift register which shifts a level of said first control signals based on an output of said sense amplifier.

4. An analog voltage supply circuit for a non-volatile memory comprising:

a write voltage generation circuit which generates a write voltage that is applied to a control gate of a memory cell in said non-volatile memory during a write operation, based on an input analog voltage;

a verify voltage generation circuit which generates a verify voltage that is applied to said control gate during a verify operation, based on said input analog voltage;

a first source voltage generation circuit having a first inverting amplifier which generates a source voltage that is applied to a source of said memory cell during the write operation, wherein said source voltage is changed by changing a gain of said inverting amplifier responsive to first control signals;

a second source voltage generation circuit having a second inverting amplifier which generates a source voltage that is applied to the source of said memory cell during the verify operation, wherein said verify source voltage is changed by changing a gain of the second inverting amplifier responsive to second control signals;

a sense amplifier which compares a memory cell drain current with a reference comparison current during the verify operation;

a counter decoder circuit which outputs the second control signals which are equivalent to a number of write pulses applied to said memory cell; and an up-down shift register circuit which shifts a level of said first control signals based on an output of said sense amplifier.

5. An analog voltage supply circuit for a non-volatile memory comprising:

a write voltage generation circuit, having an electric charge distribution condenser and a condenser ratio amplifier, which generates a write voltage that is applied to a control gate of a memory cell in said non-volatile memory during a write operation, based on an input analog voltage, and which changes the write voltage by increasing a voltage of an electrode of the electric charge distribution condenser connected with a negative terminal of the condenser ratio amplifier as well as a voltage of another electrode of the electric charge distribution condenser not connected with the negative terminal of the condenser ratio amplifier, responsive to first control signals;

a verify voltage generation circuit which generates a verify voltage that is applied to said control gate during a verify operation, based on said input analog voltage;

a write memory cell drain voltage generation circuit having a non-inverting amplifier which generates a write memory cell drain voltage during the write operation, said write memory cell drain voltage is changed by varying a gain of the non-inverting amplifier;

a multi-level sense amplifier which compares a current mirror ratio current of a memory cell drain current with a reference comparison current during the verify operation;

a counter decoder circuit which outputs a signal equivalent to a number of write pulses applied to said memory cell;

a comparison circuit which compares an output of said multi-level sense amplifier with the number of write pulses determined by said counter decoder circuit; and an up-down shift register circuit which shifts a level of said first control signals based on a comparison result provided by said comparison circuit.

6. An analog voltage supply circuit for a non-volatile memory comprising:

a write voltage generation circuit, having an electric charge distribution condenser and a condenser ratio amplifier, which generates a write voltage that is applied to a control gate of a memory cell in said non-volatile memory during a write operation, based on an input analog voltage, and which changes the write voltage by increasing a voltage of a positive terminal of the condenser ratio amplifier and the electric charge distribution condenser responsive to control signals;

a verify voltage generation circuit which generates a verify voltage that is applied to said control gate during verify operation, based on said input analog voltage;

a write memory cell drain voltage generation circuit having a non-inverting amplifier which generates a write memory cell drain voltage during the write operation, said write memory cell drain voltage is changed by varying a gain of the non-inverting amplifier;

a multi-level sense amplifier which compares a current mirror ratio current of a memory cell drain current with a reference comparison current during the verify operation;

a counter decoder circuit which outputs a signal equivalent to a number of write pulses applied to said memory cell;

a comparison circuit which compares an output of said multi-level sense amplifier with the number of write pulses determined by said counter decoder circuit; and an up-down shift register circuit which shifts a level of said control signals based on a comparison result provided by said comparison circuit.

7. An analog voltage supply circuit for a non-volatile memory comprising:

a write memory cell drain voltage generation circuit, having an electric charge distribution condenser and a condenser ratio amplifier, which generates a write voltage that is applied to a control gate of a memory cell in said non-volatile memory during a write operation, based on an input analog voltage, and which changes the write voltage by increasing a voltage of an electrode of an electric charge distribution condenser connected with a negative terminal of the condenser ratio amplifier as well as a voltage of another electrode of the electric charge distribution condenser not connected with the negative terminal of the condenser ratio amplifier, responsive to control signals;

a verify voltage generation circuit which generates a verify voltage that is applied to said control gate during a verify operation, based on said input analog voltage;

a write memory cell drain voltage generation circuit having a non-inverting amplifier which generates a write memory cell drain voltage during the write operation, said write memory cell drain voltage is changed by varying a gain of the non-inverting amplifier;

a multi-level sense amplifier which compares a memory cell drain current with a current mirror ratio current of a reference comparison current during the verify operation;

a counter decoder circuit which outputs a signal equivalent to a number of write pulses applied to said memory cell;

a comparison circuit which compares an output of said multi-level sense amplifier with the number of write pulses determined by said counter decoder circuit; and an up-down shift register circuit which shifts a level of said control signals based on a comparison result provided by said comparison circuit.

8. An analog voltage supply circuit for a non-volatile memory comprising:

a write voltage generation circuit, having an electric charge distribution condenser and a condenser ratio amplifier, which generates a write voltage that is applied to a control gate of a memory cell in said non-volatile memory during a write operation, based on an input analog voltage, and which changes the write voltage by increasing a voltage of a positive terminal of the condenser ratio amplifier and the electric charge distribution condenser responsive to control signals;

a verify voltage generation circuit which generates a verify voltage that is applied to said control gate during a verify operation, based on said input analog voltage;

a write memory cell drain voltage generation circuit having a non-inverting amplifier which generates a write memory cell drain voltage during the write operation, said write memory cell drain voltage is changed by varying a gain of the non-inverting amplifier;

a multi-level sense amplifier which compares a memory cell drain current with a specific current mirror current of a reference comparison current during the verify operation;

a counter decoder circuit which outputs a signal equivalent to a number of write pulses applied to said memory cell;

a comparison circuit which compares an output of said multi-level sense amplifier with the number of write pulses determined by said counter decoder circuit; and an up-down shift register circuit which shifts a level of said control signals based on a comparison result provided by said comparison circuit.

* * * * *